United States Patent
Aoai et al.

(10) Patent No.: US 7,138,217 B2
(45) Date of Patent: *Nov. 21, 2006

(54) POSITIVE RESIST COMPOSITION

(75) Inventors: Toshiaki Aoai, Shizuoka (JP); Kazuyoshi Mizutani, Shizuoka (JP); Shinichi Kanna, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 128 days.

This patent is subject to a terminal disclaimer.

(21) Appl. No.: 10/099,981

(22) Filed: Mar. 19, 2002

(65) Prior Publication Data

US 2002/0168584 A1 Nov. 14, 2002

(30) Foreign Application Priority Data

Mar. 19, 2001 (JP) .................. P. 2001-079184

(51) Int. Cl.
- G03F 7/004 (2006.01)
- G03F 7/038 (2006.01)
- G03F 7/26 (2006.01)
- G03F 7/32 (2006.01)

(52) U.S. Cl. .................. 430/270.1; 430/326; 430/907; 430/910; 430/921

(58) Field of Classification Search ............. 430/270.1, 430/907
See application file for complete search history.

(56) References Cited

U.S. PATENT DOCUMENTS

| | | | | |
|---|---|---|---|---|
| 6,159,656 A | * | 12/2000 | Kawabe et al. | 430/270.1 |
| 6,479,211 B1 | * | 11/2002 | Sato et al. | 430/270.1 |
| 6,506,535 B1 | * | 1/2003 | Mizutani et al. | 430/270.1 |
| 6,610,456 B1 | * | 8/2003 | Allen et al. | 430/270.1 |
| 6,713,228 B1 | * | 3/2004 | Kim et al. | 430/270.1 |
| 6,878,502 B1 | * | 4/2005 | Mizutani et al. | 430/270.1 |
| 2002/0061464 A1 | * | 5/2002 | Aoai et al. | |
| 2002/0155376 A1 | * | 10/2002 | Hashimoto et al. | 430/270.1 |

FOREIGN PATENT DOCUMENTS

| | | |
|---|---|---|
| DE | 42 07 261 A1 A1 | 9/1993 |
| WO | WO 00/67072 A1 | 9/2000 |

OTHER PUBLICATIONS

Ito et al. J.Vacuum Sci. Tech.B, 2001 19(6) 2678-2684.*

* cited by examiner

Primary Examiner—Rosemary Ashton
(74) Attorney, Agent, or Firm—Sughrue Mion, PLLC

(57) ABSTRACT

A positive resist composition comprises: (A) a resin capable of decomposing by the action of an acid to increase the solubility in an alkali developer; and (B) a compound capable of generating an acid upon irradiation with one of an actinic ray and a radiation, wherein the resin (A) contains a specified repeating unit.

40 Claims, No Drawings

POSITIVE RESIST COMPOSITION

FIELD OF THE INVENTION

The present invention relates to a positive resist composition used in micro-lithographic processes for the manufacture of VLSI's and micro-tips with large capacities, and other photo-fabrication processes. More specifically, the invention relates to a positive resist composition capable of forming fine patterns with use of a vacuum ultraviolet ray having a wavelength of not longer than 160 nm.

BACKGROUND OF THE INVENTION

Integrated circuits are still raising the degree of integration; in the manufacture of semiconductor tips such as VLSI's, ultra-fine patterns comprising line widths of not more than a quarter micron must be processed. As one of the means to reduce the pattern dimensions, the use of an exposure energy source emitting a short wavelength radiation for the pattern formation is well known. The merit of shorter wavelength exposures can be understood by the Rayleigh's equation relating the resolution (line width) of an optical system to the wavelength of light.

$$R = k \cdot \lambda / NA$$

in which $\lambda$ represents the wavelength of the light emitted from an exposure energy source, NA represents the numerical aperture of a lens and k represents a process constant. This equation teaches that, to achieve a high resolution, i.e., decrease the value of R, the wavelength of the light emitted from the exposure energy source must be shortened.

As an example, in the manufacture of semiconductor tips having a degree of integration up to 64 M bits, the i line (365 nm) of the high-pressure mercury lamp has been used as the exposure light. As positive resists for this kind of light, a number of compositions based on a novolac resin and a photo-sensitive naphthoquinonediazide have been developed, which have achieved a sufficient success in the processing of lines having widths up to about 0.3 µm. In the manufacture of semiconductor tips having a degree of integration of 256 Megabits or higher, the KrF excimer laser light (248 nm) instead of the i line has been adopted for exposure.

Further, in order to cope with the semiconductor manufacture with a degree of integration not less than 1 G bits, the use of the ArF excimer laser light (193 nm) and the $F_2$ excimer laser light (157 nm) is under investigation for the formation of patterns finer than 0.1 µpm.

To meet such changes in the wavelength of exposure light, the composition of the resist material is also changing drastically. Since the conventional novolac resin and naphthoquinonediazide-based resist exhibits a strong absorption in the deep UV region around 248 nm, the deep UV light is difficult to reach the bottom portion of the resist, thus giving patterns having a tapered cross-section, requiring a large amount of exposure.

To solve such problems, chemically amplified resists have been developed in which a resin having a principal structure of poly(hydroxystyrene) that exhibits a weak absorption in the 248 nm region and is protected by a acid-decomposable group and a compound (photo acid generator) that generates an acid by the irradiation of a UV light are used together. Since the chemically amplified resist changes the solubility in the developer via a decomposition reaction catalyzed by the acid generated at exposed areas, it can form high-resolution patterns with a small amount of exposure.

Acid-decomposable resins and photo acid generators useful for such systems are reported in a number of papers and patents including Polym. Eng. Sci., 23, 1012 (1983), ACS. Sym., 242, 11 (1984), Macromolecules, 21, 1475 (1988), J. the Soc. of Synthet. Org. Chem., Japan, 49, 437 (1991) and *Bisai Kako to Resisto* (Micro-processing and Resist), published by Kyoritsu Shuppan Co., Ltd. in 1987. In the case of using the ArF excimer laser light (193 nm), the chemically amplified resists did not show satisfactory performance since compounds having an aromatic group exhibit a strong absorption at the 193 nm wavelength region.

To solve the above problem, an improvement of chemically amplified resists is being investigated by replacing the acid-decomposable resin having a basic structure of poly (hydroxystyrene) to another acid-decomposable resin in which an alicyclic structure not absorbing 193 nm light is introduced in the main or side chain of the polymer.

References can be made on such alicyclic, acid-decomposable resins to, for example, Japanese Patent Laid-Open Nos . 39665/1992, 234511/1995, 73173/1997, 199467/1995, 259626/1996, 221519/1997, 10739/1998, 230595/1997, 111569/1998, 218947/1998 and 153864/1998, and WO-97/33198.

Even the alicyclic resins proved to strongly absorb 157 nm region radiations, thus being unable to form 0.1 µm or finer patterns with use of the $F_2$ excimer laser light (157 nm). In contrast, it has been reported in Proc. SPIE, 3678, 13 (1999) that resins to which fluorine atoms are introduced in the form of perfluoro group exhibit a sufficient transparency in the 157 nm radiation. Further, effective molecular structures of such fluorine-containing resins have been proposed in Proc. SPIE, 3999, 330, 357 and 365 (2000), and WO-00/17712.

However, the resist based on these fluorine-containing resins sometimes exhibit insufficient levels of resistance against dry etching. Moreover, due to the specific water- and oil-repelling nature originating from the perfluoro structure, the coating performance has been expected to improve to secure the uniformity of the coated surface, and the suppression of development defect has also been expected.

SUMMARY OF THE INVENTION

Accordingly, a purpose of the invention is to provide a positive resist composition suitably used for the exposure source having a wave length of not more than 160 nm, particularly $F_2$ excimer laser beam (157 nm), and is more specifically to provide a positive resist composition exhibiting a sufficient transparency to 157 nm region radiations as well as desirable coating property and developing performances free of development defect.

Moreover, another purpose of the invention is to provide a positive resist composition that is highly sensitive, capable of forming fine patterns with a high resolution and excels in the resistance against dry etching.

The present inventors have devised the invention by finding that the above-cited purposes can be achieved perfectly by specific compositions to be described below as the result of an extensive study on the various properties and requirements cited above.

The invention is constituted as follows.

(1) A positive resist composition comprising:

(A) a resin capable of decomposing by the action of an acid to increase the solubility in an alkali developer; and (B) a compound capable of generating an acid upon irradiation with one of an actinic ray and a radiation, wherein the resin (A) contains a repeating unit represented by formula (I):

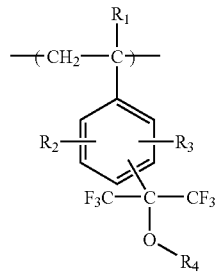

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group group which may be substituted; $R_4$ represents a hydrogen atom, an alkyl group which may be substituted, perfluoroalkyl group which maybe substituted, cycloalkyl group which may be substituted, acyl group which may be substituted, alkoxycarbonyl group which may be substituted, alkoxycarbonylmethyl group which may be substituted or a group represented by formula (II):

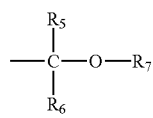

wherein $R_5$ and $R_6$, which are the same or different, each independently represents a hydrogen atom, an alkyl group which maybe substituted or cycloalkyl group which may be substituted; $R_7$ represents an alkyl group which may be substituted, perfluoroalkyl group which maybe substituted, cycloalkyl group which may be substituted, perfluorocycloalkyl group which may be substituted, aralkyl group which may be substituted or aryl group which may be substituted; two of $R_5$, $R_6$ and $R_7$ may combine with each other to form a ring.

(2) The positive resist composition according to the item (1), wherein the resin (A) further contains a repeating unit represented by formula (III):

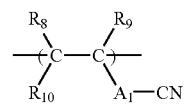

wherein $R_8$ and $R_9$, which are the same or different, each independently represents a hydrogen atom, a halogen atom, cyano group, an alkyl group which may be substituted or a haloalkyl group which may be substituted; $R_{10}$ represents a hydrogen atom, a halogen atom, an alkyl group which may be substituted, a haloalkyl group which may be substituted or a group represented by —$A_1$—CN; $A_1$ represents a single bond, an alkylene group which may be substituted, alkenylene group which may be substituted, cycloalkylene group which may be substituted or arylene group group which may be substituted, —O—CO—$R_{11}$—, —CO—O—$R_{12}$— or —CO—N($R_{13}$)—$R_{14}$—; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, cycloalkyl group which may be substituted, aralkyl group which may be substituted or aryl group which may be substituted.

(3) The positive resist composition according to the item (1), wherein the resin (A) further contains at least one of repeating units represented by formulae (IV) and (V).

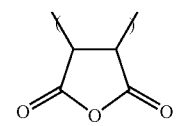

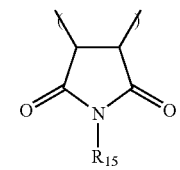

wherein $R_{15}$ represents a hydrogen atom, or an alkyl group which may be substituted, perfluoroalkyl group which may be substituted, cycloalkyl group which may be substituted, perfluorocycloalkyl group which may be substituted or aryl group which may be substituted.

(4) The positive resist composition according to the item (1), wherein the resin (A) further contains at least one of repeating units represented by formulae (VI) and (VII).

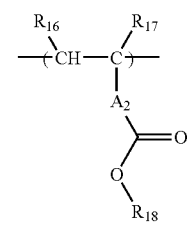

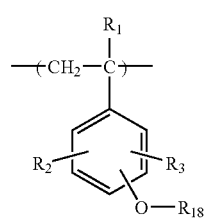

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group group which may be substituted; $R_{16}$ and $R_{17}$, which are the same or different, each independently represents a hydrogen atom, a halogen atom, cyano group, an alkyl group which maybe substituted or a haloalkyl group which maybe substituted; $R_{18}$ represents —$C(R_{19})(R_{20})(R_{21})$, —$C(R_{19})(R_{20})(R_{22})$, or the group represented by formula (VIII) below; $R_{19}$ to $R_{22}$, which are the same or different, each independently represents an alkyl group, a mono- or polycyclic cycloalkyl group, an alkenyl group, an aralkyl group or an aryl group, each of which maybe substituted; two of $R_{19}$, $R_{20}$ and $R_{21}$ or two of $R_{19}$, $R_{20}$ and $R_{22}$ may combine with each other to form a ring; $A_2$ represents a single bond, an alkylene group which may be substituted, alkenylene group which may be substituted, cyclo alkylene group which may be substituted or arylene group group which may be substituted, —O—CO—$R_{11}$—, —CO—O—$R_{12}$— or —CO—N($R_{13}$)—$R_{14}$—; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, cycloalkyl group which may be substituted, aralkyl group which may be substituted or aryl group which may be substituted:

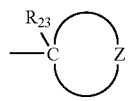

(VIII)

wherein $R_{23}$ represents an alkyl group, cycloalkyl group, alkenyl group, alkynyl group, aralkyl group or aryl group, each of which may be substituted; Z represents an atomic group forming a mono- or polycyclic alicyclic group together with the carbon atom.

(5) The positive resist composition according to the item (1), which further comprises (C) a compound containing a basic nitrogen atom as an acid diffusion-suppressing agent.

(6) The positive resist composition according to the item (1), wherein the compound (B) is at least one selected from the group consisting of a sulfonium salt compound and an iodonium salt compound capable of generating the following acid upon irradiation with one of an actinic ray and a radiation:

at least one acid of a perfluoroalkylsulfonic acid having at least 2 carbon atoms, a perfluoroarylsulfonic acid and an arylsulfonic acid substituted with a perfluoroalkyl group.

(7) The positive resist composition according to the item (1), wherein the compound (B) is at least one selected from the group consisting of an imide-N-sulfonate compound, an oxime-N-sulfonate compound and a disulfonic compound.

(8) The positive resist composition according to the item (1), wherein the resin (A) contains the repeating unit represented by formula (I) in an amount of 20 to 100 mol% based on the total components of the resin.

(9) The positive resist composition according to the item (1), wherein the resin (A) has a weight average molecular weight of 1,000 to 200,000.

(10) The positive resist composition according to the item (1), which comprises the resin (A) in an amount of 50 to 99.5% by weight, based on the total solid content of the composition.

(11) The positive resist composition according to the item (1), which comprises the compound (B) in an amount of 0.1 to 20% by weight, based on the total solid content of the composition.

(12) The positive resist composition according to the item (1), which further comprises a surfactant containing at least one of a fluorine atom and a silicon atom.

(13) The positive resist composition according to the item (1), which is a positive resist composition to be irradiated with a vacuum ultraviolet ray having a wavelength of not longer than 160 nm.

(14) The positive resist composition according to the item (1), which is a positive resist composition to be irradiated with $F_2$ excimer laser beam having a wavelength of 157 nm.

(15) A method for forming a pattern comprises: applying the positive resist composition according to any one of the above-mentioned items on a substrate to form a resist film; irradiating the resist film with a vacuum ultraviolet ray having a wavelength of not longer than 160 nm; and developing the resist film.

(16) The method for forming a pattern according to item (15), wherein the vacuum ultraviolet ray is $F_2$ excimer laser beam having a wavelength of 157 nm.

DETAILED DESCRIPTION OF THE INVENTION

Now, the compounds used in the invention are explained in detail.

[1] Resin (A) of the Invention

The resin (A) of the invention comprises at least one repeating unit represented by general formula (I), i.e., a styrene derivative substituted with hexafluoro-2-propanol or the group in which the OH group of hexafluoro-2-propanol is protected with an acid-decomposable group. Preferably, the resin further contains at least one repeating unit represented by general formula (III) and is decomposed by the action of an acid to increase the solubility in alkaline developers. If required and necessary, at least one repeating unit represented by general formulae (IV) to (VII) may be further contained in the resin in (A) to control its hydrophilicity, glass transition temperature, and the transmittance to the exposure light, or to control its reactivity during polymer synthesis.

In the general formula, $R_1$ represents a hydrogen atom, a halogen atom, cyano group, or an unsubstituted or substituted alkyl or haloalkyl group. $R_2$ and $R_3$ which can be the same or different each represents a hydrogen atom, hydroxyl group, a halogen atom, cyano group, an alkoxy group, an acyl group or an unsubstituted or substituted alkyl, cycloalkyl, alkenyl, aralkyl or aryl group.

$R_4$ represents a hydrogen atom, an alkyl group, a perfluoroalkyl group, a mono-or polycyclic cycloalkyl group, acyl, an alkoxycarbonyl group, an alkoxycarbonylmethyl group all of which may be substituted, or the one represented by formula (II).

$R_5$ and $R_6$ which can be the same or different each represents a hydrogen atom, an unsubstituted or substituted alkyl or cycloalkyl group. $R_7$ represents an alkyl, perfluoroalkyl, cycloalkyl, perfluorocycloalkyl aralkyl or aryl group all of which may be substituted. Further, two of $R_5$ to $R_7$ may combine together to form a ring.

$R_8$ and $R_9$, which may be the same or different, each represents a hydrogen atom, a halogen atom, cyano group, or an unsubstituted or substituted alkyl or haloalkyl group. $R_{10}$ represents a hydrogen atom, a halogen atom, an unsubstituted or substituted alkyl or haloalkyl group or —$A_1$—CN. $A_1$ and $A_2$ each independently represents a single bond, an unsubstituted or substituted divalent alkylene, alkenylene, cycloalkylene or arylene group, —O—CO—$R_{11}$—, —CO—O—$R_{12}$— or —CO—N($R_{13}$)—$R_{14}$—.

$R_{11}$, $R_{12}$ and $R_{14}$, which may the same or different, a single bond, a divalent alkylene, alkenylene, cycloalkylene or arylene group all of which may be substituted with an ether group, an ester group, an amido group, a urethane group or a ureido group. $R_{13}$ represents a hydrogen atom, an unsubstituted or substituted alkyl, cycloalkyl, aralkyl or aryl group. $R_{15}$ represents a hydrogen atom, or an unsubstituted or substituted alkyl, perfluoroalkyl, cycloalkyl, perfluorocycloalkyl or aryl group.

$R_{16}$ and $R_{17}$, which may be the same or different, each represents a hydrogen atom, a halogen atom, cyano group, or an unsubstituted or substituted alkyl or haloalkyl group. $R_{18}$ represents —C($R_{19}$)($R_{20}$)($R_{21}$), —C($R_{19}$)($R_{20}$)($R_{22}$), or the group represented by formula (VIII). $R_{19}$ to $R_{22}$, which maybe the same or different, each represents an alkyl, a mono- or polycyclic cycloalkyl, alkenyl, aralkyl or aryl group which may be substituted.

Alternatively, two of $R_{19}$, $R_{20}$ and $R_{21}$, or two of $R_{19}$, $R_{20}$ and $R_{22}$ may combine together to form a ring. $R_{23}$ represents an alkyl, cycloalkyl, alkenyl, alkynyl, aralkyl or aryl group that may be substituted. Z represents an atomic group forming a mono- or polycyclic group together with the carbon atom.

Preferable examples of the alkyl group mentioned above include those of 1 to 8 carbon atoms, and specifically methyl, ethyl, propyl, n-butyl, sec-butyl, hexyl, 2-ethylhexyl and octyl. The cycloalkyl group may be monocyclic or polycyclic; the monocyclic groups preferably include those of 3 to 8 carbon atoms, i.e., for example, cyclopropyl, cyclopentyl, cyclohexyl, cyclobutyl and cyclooctyl. The polycyclic groups include those of 6 to 20 carbon atoms such as, for example, adamantyl, norbornyl, isobornyl, camphanyl, dicyclopentyl, α-pinel, tricyclodecanyl, tetracyclododecyl and androstanyl.

Preferable perfluoroalkyl groups are, for example, those with 1 to 12 carbon atoms specifically including trifluoromethyl pentafluoroethyl, 2,2,2-trifluoroethyl, heptafluoropropyl, 2,2,3,3,3-pentafluoro-1-propyl, 2,2,3,4,4,4-hexafluoro-1-butyl, 2,2,3,3,4,4,4-heptafluoro-1-butyl, 2,2,3,3,4,4,5,5-octafluoro-1-pentyl, perfluorobutyl, perfluorohexyl, perfluorohexylethyl, perfluoroheptylmethyl, perfluorooctyl, perfluorooctylethyl and perfluorodecylethyl.

Preferable perfluorocycloalkyl groups include monocyclic or polycyclic ones substituted with plural fluorine atoms. As the monocyclic groups, those with 3 to 8 carbon atoms are included such as, for example, perfluorocyclopropyl, perfluorocyclopentyl and perfluorocyclohexyl. As the polycyclic groups, those with 6 to 20 carbon atoms are included such as, for example, perfluoroadamantyl, perfluoronorbornyl, perfluoroisobornyl, perfluorotricyclodecanyl and perfluorotetracyclododecyl. Preferable haloalkyl groups are those with 1 to 4 carbon atoms specifically including chloromethyl, chloroethyl, chloropropyl, chlorobutyl, bromomethyl and bromoethyl.

Preferable aryl groups are, for example, those with 6 to 15 carbon atoms, specifically including phenyl, tolyl, dimethylphenyl, 2,4,6-trimetylphenyl, naphthyl, anthryl and 9,10-dimethoxyanthryl. Preferable aralkyl groups are, for example, those with 7 to 12 carbon atoms, specifically including benzyl, phenethyl and naphthylmethyl.

Preferable alkenyl groups are, for example, those with 2 to 8 carbon atoms, specifically including vinyl, allyl, butenyl and cyclohexenyl. Preferable alkoxyl groups are, for example, those with 1 to 8 carbon atoms, specifically including methoxy, ethoxy, n-propoxy, iso-propoxy, butoxy, pentoxy, allyloxy and octoxy.

Preferable acyl groups are, for example, those with 1 to 10 carbon atoms, specifically including formyl, acetyl, propanoyl, butanoyl, pivaloyl, octanoyl and benzoyl. Preferable alkoxycarbonyl groups include tertiary ones such as t-butoxycarbonyl, t-amyloxycarbonyl and 1-methyl-1-cyclohexyloxycarbonyl. Preferable alkoxycarbonylmethyl groups include tertiary ones such as t-butoxycabonylmethyl, t-amyloxycarbonylmethyl and 1-methyl-1-cyclohexyloxycarbonylmethyl.

Preferable alkelene groups include those with 1 to 8 carbon atoms such as methylene, ethylene, propylene, butylene, hexylene and octylene all of which may be substituted. Preferable alkenylene groups include those with 2 to 6 carbon atoms such as ethenylene, propenylene and butenylene all of which may be substituted. Preferable cycloalkylene groups include those with 5 to 8 carbon atoms such as cyclopentylene and cyclohexylene. Preferable arylene groups include those with 6 to 15 carbon atoms such as phenylene, tolylene and naphthylene.

The ring formed by the connection of two groups from $R_5$ to $R_7$, or from $R_{19}$ to $R_{22}$ is, for example, 3- to 8-membered, and includes cyclopropane, cyclopentane, cyclohexane, furan, pyrane, dioxonol and 1,3-dioxalane. Z represents an atomic group constituting a monocyclic or polycyclic alicyclic group, and the alicyclic rings to be completed contain 3 to 8 carbon atoms, preferably including, for example, cyclopropyl, cyclopentyl, cyclohexyl, cycloheptyl and cyclooctyl. The polycyclic rings contain 6 to 20 carbon atoms, including, for example, adamantyl, norbornyl, isobornyl, camphanyl, dicylcopentyl, α-pinel, tricyclodecanyl, tetracyclododecyl and androstanyl.

Substituents for these groups include those having an active hydrogen atom such as amino group, an amido group, a ureido group, a urethane group, hydroxyl group and a carboxyl group, a halogen (F, Cl, Br and I) atom, an alkoxy (methoxy, ethoxy, propoxy and butoxy) group, a thioether group, an acyl (acetyl, propanoyl and benzoyl), an alkoxycarbonyl (methoxycarbonyl, ethoxycarbonyl and propoxycarbonyl) group, cyano group and nitro group.

The acid-decomposable group (the group decomposed by the action of an acid to exhibit a solubility in alkalis) in the resin (A) includes, for example, —O—C($R_{19}$)($R_{20}$)($R_{21}$), —O—C($R_{19}$)($R_{20}$)($R_{22}$), —O—COO—C($R_{19}$)($R_{20}$)($R_{21}$) —O—C($R_{01}$)($R_{02}$)COO—C($R_{19}$)($R_{20}$)($R_{21}$), —COO—C($R_{19}$)($R_{20}$)($R_{21}$), and —COO—C($R_{19}$)($R_{20}$)(O$R_{22}$). $R_{19}$ to $R_{22}$ have the same meaning as above, and $R_{01}$ and $R_{02}$ each represents a hydrogen atom, an alkyl group, a cycloalkyl group, an alkenyl group, an aralkyl group or an aryl group, all of which may be substituted with a substituent shown above.

Preferable examples include the ether or ester group of a tertiary alkyl group such as t-butyl, t-amyl, 1-alkyl-1-cyclohexyl, 2-alkyl-2-adamantyl, 2-adamantyl-2-propyl and 2-(4-methylcyclohexyl)-2-propyl, an acetal or acetal ester group such as 1-alkoxy-1-ethoxy and tetrahydropyranyl, a t-alkylcarbonate group and a t-alkylcarbonylmethoxy group. More preferable examples are acetal groups such as 1-alkoxy-1-ethoxy or tetrahydropyranyl.

Such acetal groups are actively decomposed by an acid, which expands the range of selection of the acid-generating compound to be jointly used. Therefore, they are advantageous as for sensitivity enhancement and the property shift occurring in the interval from exposure to post-baking. Particularly preferable acetal groups are those containing the alkoxy group derived from the aforementioned perfluoroalkyl group as the 1-alkoxy component of the acetal. With such a compound, the transmittance of short wavelength rays including the 157 nm light from the $F_2$ excimer laser can be further raised.

The total content of the repeating unit(s) represented by general formula (I) is usually 20 to 100 mol %, preferably 30 to 80 mol%, and still more preferably 40 to 70 mol % in the total amount of the polymer component.

The total content of the repeating unit(s) represented by general formula (III) is usually 0 to 80 mol %, preferably 20 to 60 mol %, and still more preferably 30 to 50 mol % in the total amount of the polymer component.

The total content of the repeating units represented by general formulae (IV) to (V) is usually 0 to 50 mol %, preferably 0 to 40 mol %, and still more preferably 0 to 30 mol % in the total amount of the polymer component.

The total content of the repeating units represented by general formulae (VI) to (VII) is usually 0 to 60 mol %, preferably 10 to 50 mol %, and still more preferably 20 to 40 mol % in the total amount of the polymer component.

The resin (A) of the invention can contain, in addition to the repeating units cited above, another polymerizable monomer as a copolymerization component for the purpose of improving various properties of the positive resist of the invention.

Copolymerization monomers applicable to the present purpose are those having one addition-polymerizable unsaturated group, including, for example, acrylic acid esters, acrylamide derivatives, methacrylic acid esters, methacrylamide derivatives, allyl compounds, vinyl ethers, vinyl esters, styrene derivatives and crotonic acid esters.

Specific examples include the following.

Acrylic acid esters such as, for example, alkyl acrylates in which the alkyl group preferably has 1 to 10 carbon atoms, specifically including methyl acrylate, ethyl acrylate, propyl acrylate, amyl acrylate, cyclohexyl acrylate, ethylhexyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate and tetrahydrofurfuryl acrylate, and aryl acrylates exemplified by phenyl acrylate; methacrylic acid esters such as, for example, alkyl methacrylates in which the alkyl group preferably has 1 to 10 carbon atoms, specifically including methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate, and aryl methacrylates exemplified by phenyl methacrylate, cresyl methacrylate and naphthyl methacrylate; acrylamides such as acrylamide and N-alkylacrylamides (the alkyl group preferably having 1 to 10 carbon atoms, specifically including, for example, methyl, ethyl, propyl, butyl, t-butyl, heptyl, octyl, cyclohexyl, benzyl and hydroxyethyl), N-arylacrylamide (the aryl group being, for example, phenyl, tolyl, nitrophenyl, naphthyl, cyanophenyl, hydroxyphenyl and carboxyphenyl), N,N-dialkylacrylamide (the alkyl group preferably having 1 to 10 carbon atoms, including, for example, methyl, ethyl, butyl, isobutyl, ethylhexyl and cyclohexyl), N,N-diarylacrylamide (the aryl group being, for example phenyl), N-methyl-N-phenylacrylamide, N-hydroxyethyl-N-methylacrylamide and N-2-acetamidoethyl-N-acetylacrylamide; methacrylamides such as methacrylamide and N-alkylmethacrylamides (the alkyl group preferably having 1 to 10 carbon atoms, specifically including, for example, methyl, ethyl, t-butyl, ethylhexyl, hydroxyethyl and cyclohexyl), N-arylmethacrylamide (the aryl group being, for example, phenyl), N,N-dialkylmethacrylamide (the alkyl group including, for example, methyl, ethyl, propyl and butyl), N,N-diarylmethacrylamide (the aryl group being, for example, phenyl), N-hydroxyethyl-N-methylmethacrylamide, N-methyl-N-phenylmethacrylamide and N-ethyl-N-phenylmethacrylamide; allyl compounds such as allyl esters (including, for example, allyl acetate, allyl capronate, allyl caprylate, allyl laurate, allyl palmitate, allyl stearate, allyl benzoate, allyl acetoacetate and allyl lactate) and allyloxyethanol; vinyl ethers such as, for example, alkyl vinyl ethers (including, for example, hexyl vinyl ether, octyl vinyl ether, decyl vinyl ether, ethylhexyl vinyl ethere, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether), vinyl aryl ether such as, for example, vinyl phenyl ether, vinyl tolyl ether, vinyl chlorophenyl ether, vinyl 2,4-dichlorophenyl ether, vinyl naphthyl ether and vinyl anthranyl ether; vinyl esters such as, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenyl butyrate, vinyl cyclohexylcarboxylate, vinyl benzoate, vinyl salicylate, vinyl chlorobenzoate, vinyl tetrachlorobenzoate and vinyl naphthoate; styrene derivatives such as, for example, styrene and alkylstyrenes (including, for example, methylstyrene, dimethylstyrene, trimethylstyrene, ethylstyrene, diethylstyrene, isopropylstyrene, butyl styrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrenes (including, for example, methoxystyrene, 4-methoxy-3-methylstyrene and dimethoxystyrene), halostyrenes (including, for example, chlorostyrene, dichlorostyrene, trichlorostyrene, tetrachlorostyrene, bentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene), carboxystyrenes and vinylnaphthalene;

crotonic acid esters such as, for example, alkyl crotonates (including, for example, butyl crotonate, hexyl crotonate and glycerin monocrotonate); dialkyl itaconates (including, for example, dimethyl itaconate, diethyl itaconate and dibutyl itaconate); dialkyl esters of maleic acid or fumaric acid (including, for example, dimethyl maleate and dibutyl maleate). Generally, any addition-polymerizable unsaturated compound that is copolymerizable may be used.

In the following, some specific examples of the repeating unit represented by general formula (I) will be shown not to restrict the scope of the invention thereto.
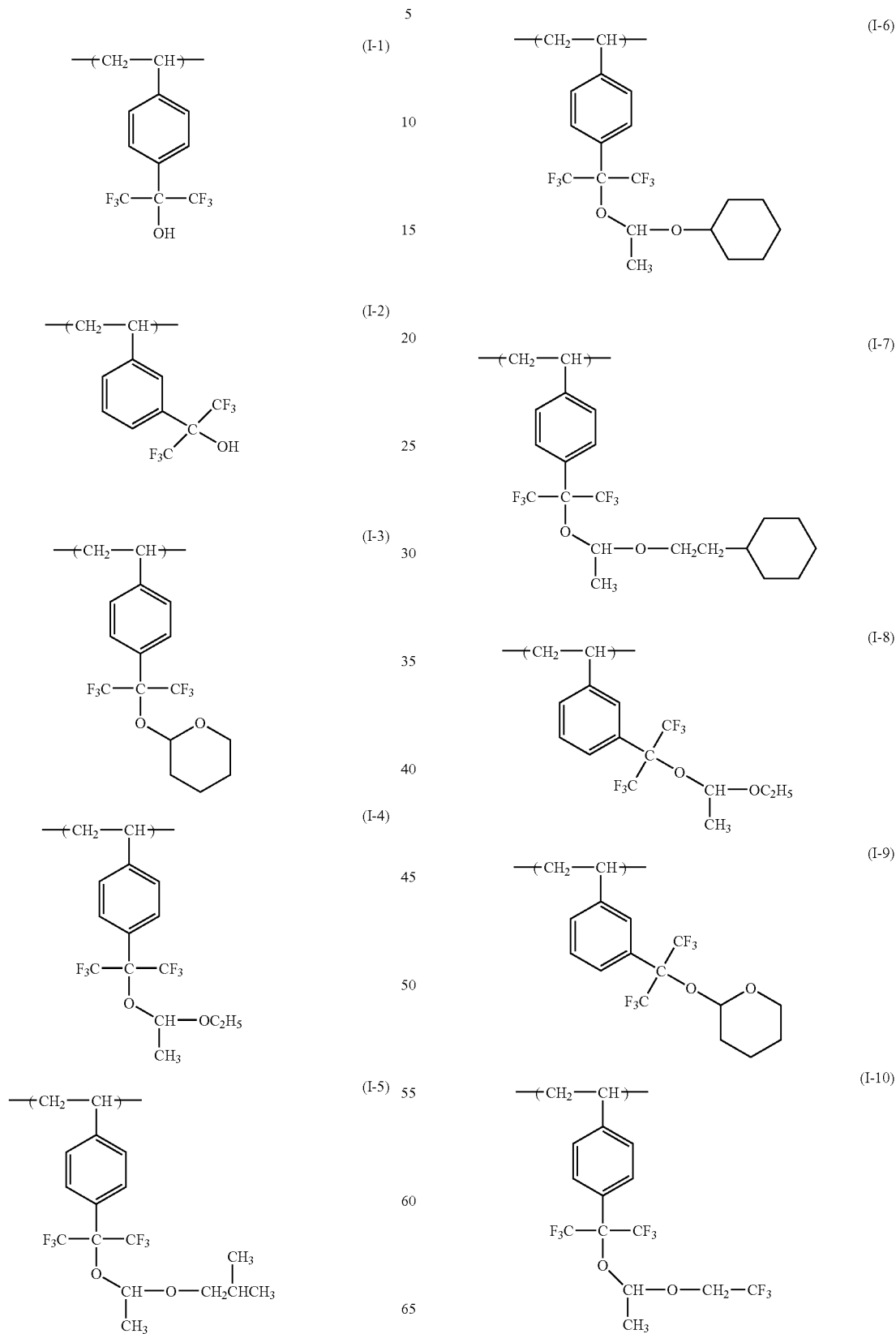

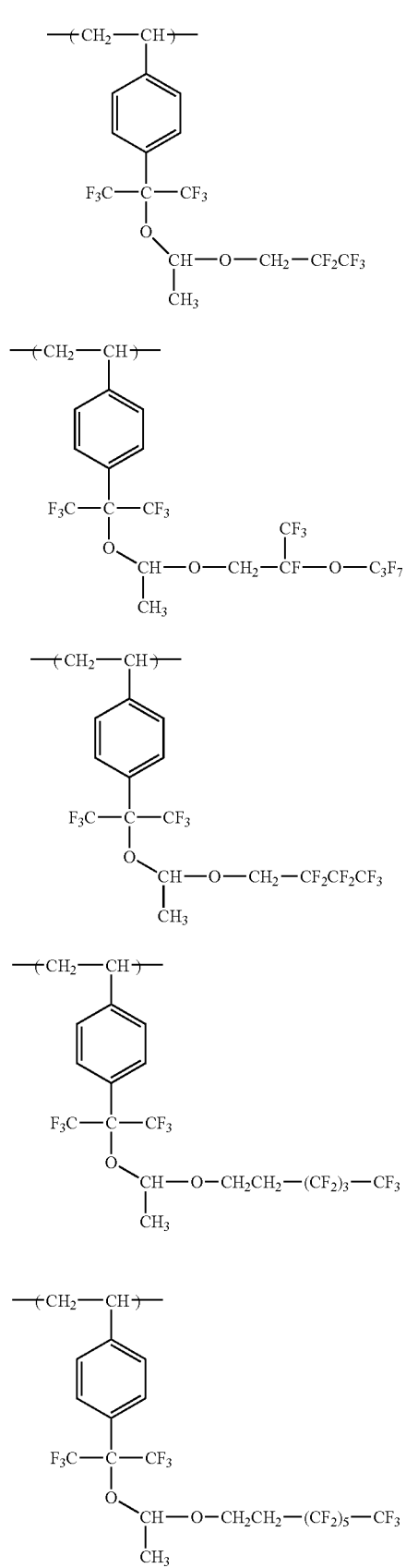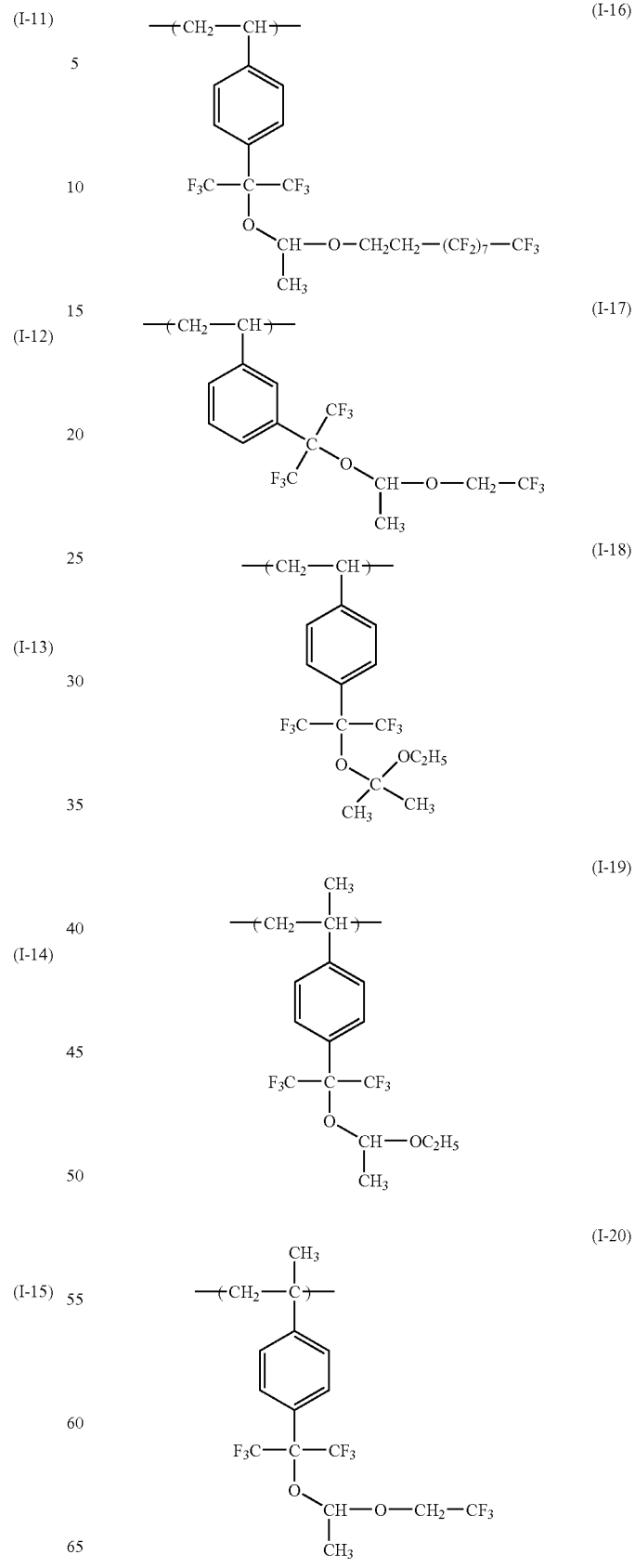

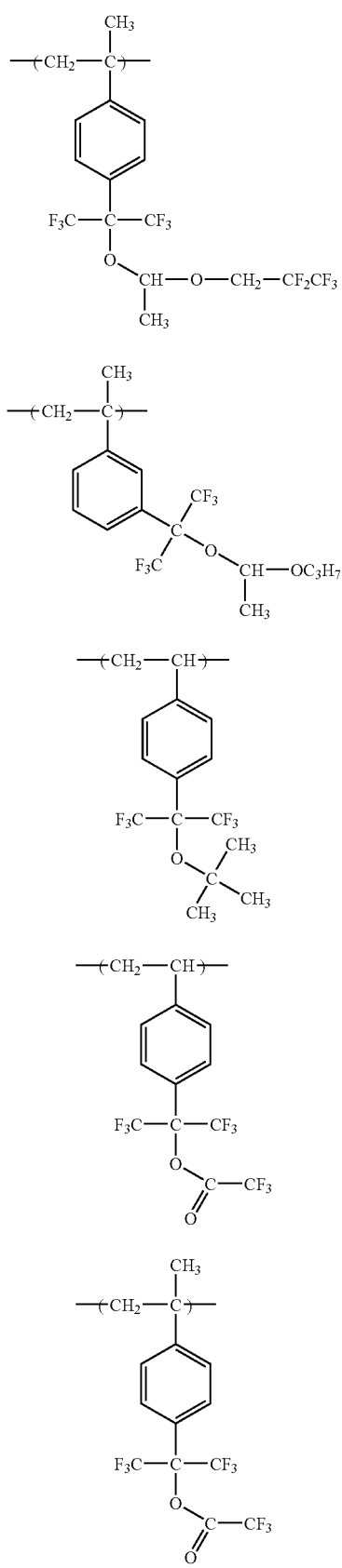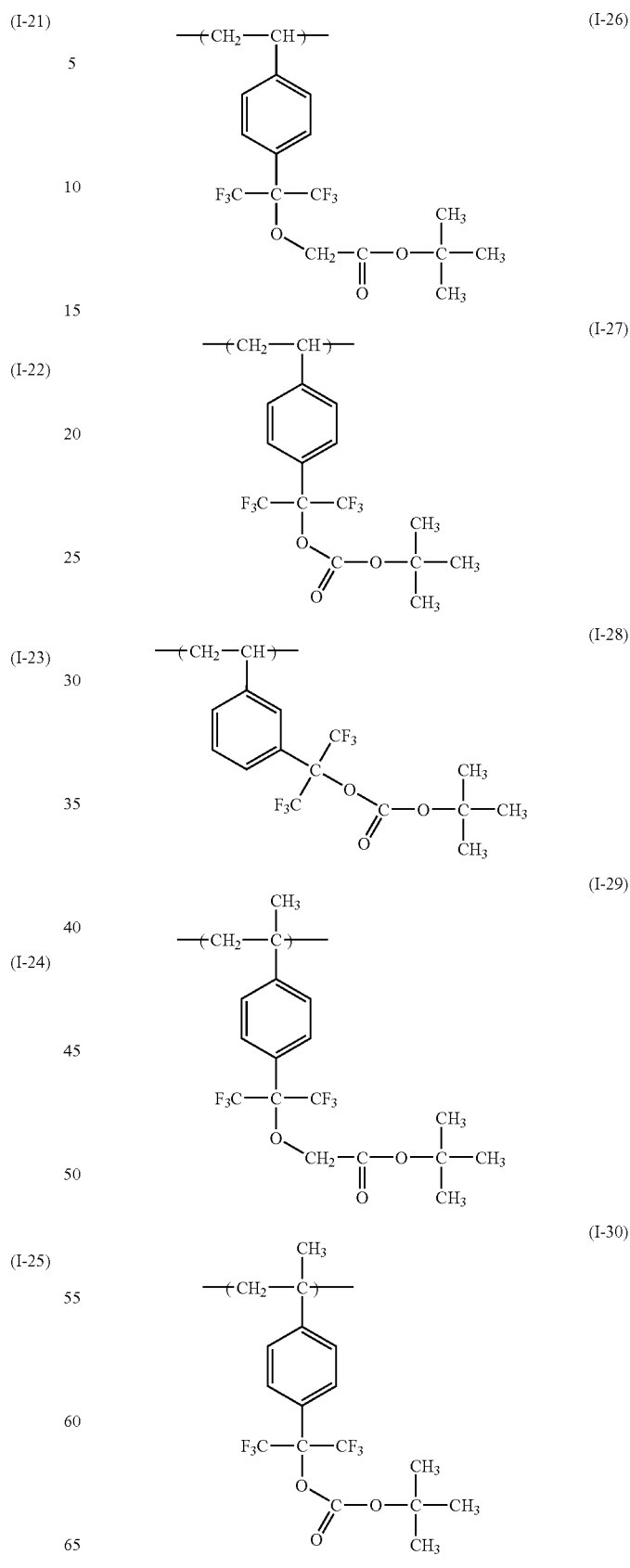

Some specific examples for the repeating units represented by general formulae (III) to (VII) are shown below, to which, however, the scope of the invention is not restricted at all.
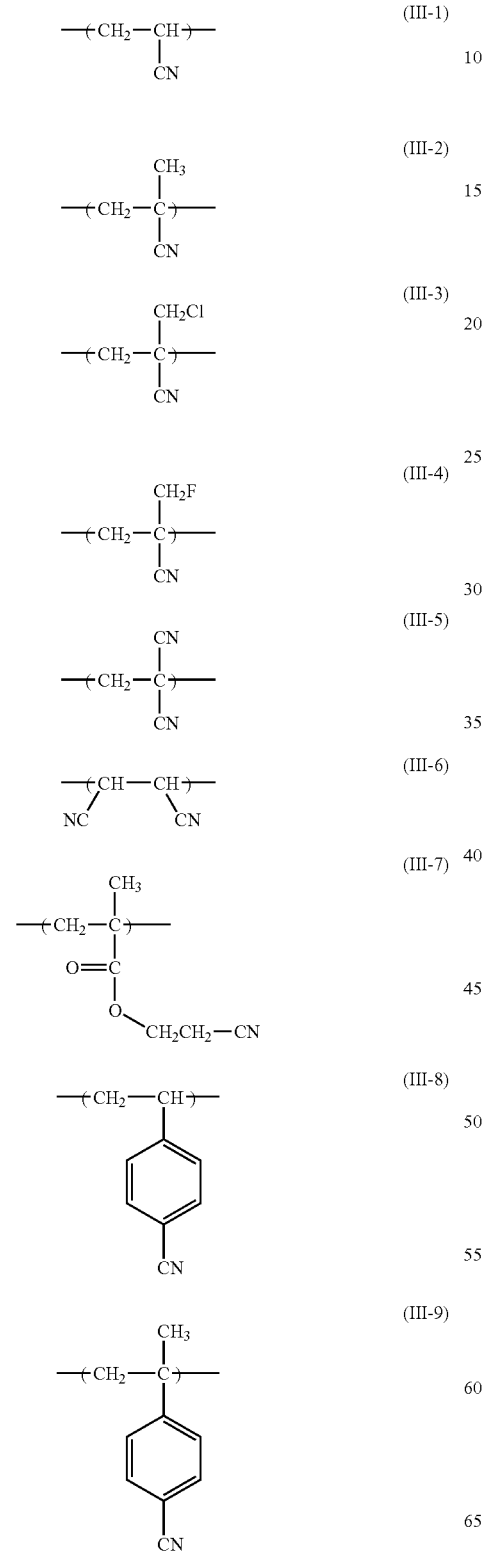
-continued
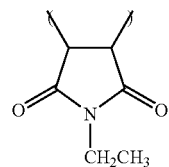 (V-1)
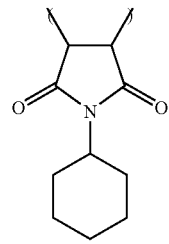 (V-2)
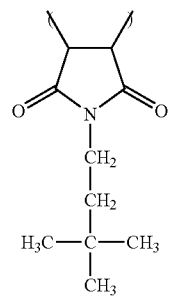 (V-3)
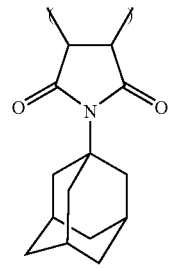 (V-4)
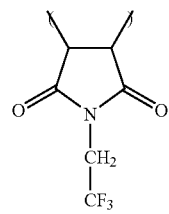 (V-5)
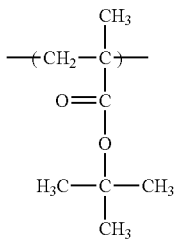 (B-1)

-continued
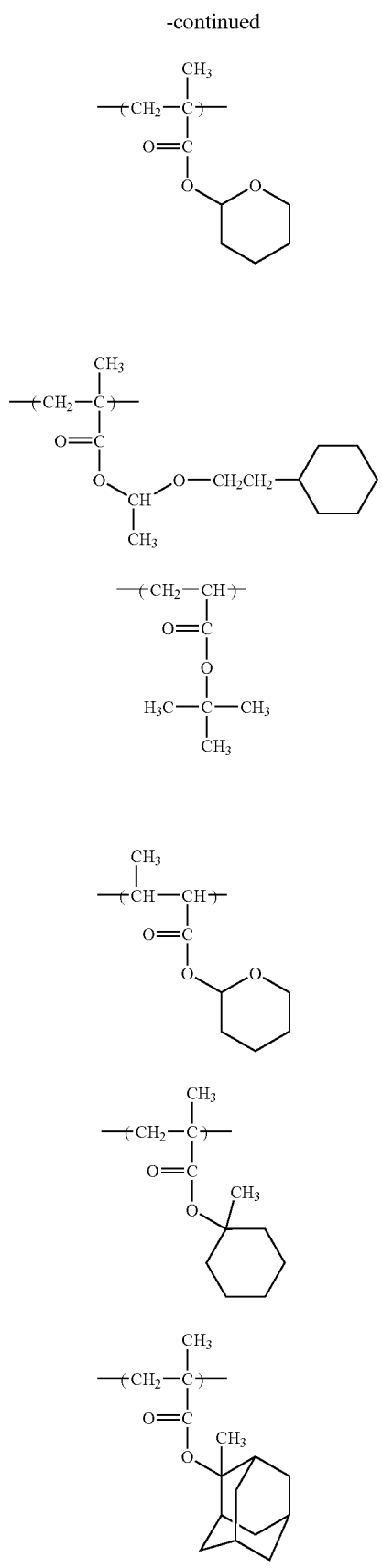
(B-2)
(B-3)
(B-4)
(B-5)
(B-6)
(B-7)
-continued
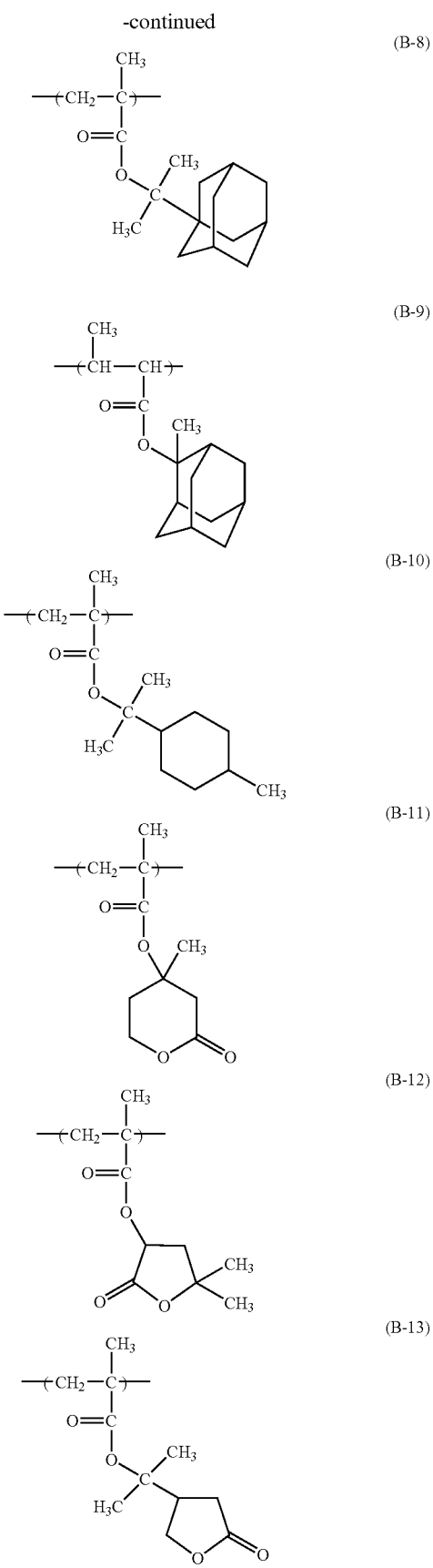
(B-8)
(B-9)
(B-10)
(B-11)
(B-12)
(B-13)

-continued (B-14) 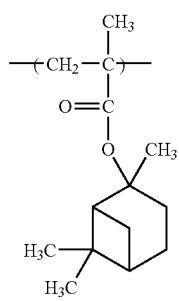

(B-15) 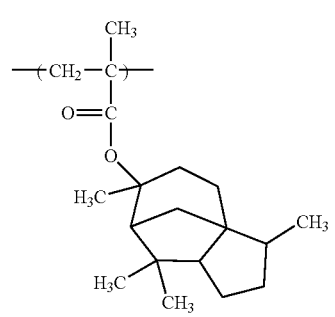

(B-31) 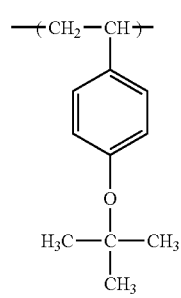

(B-32) 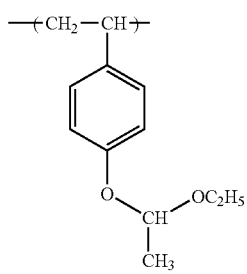

(B-33) 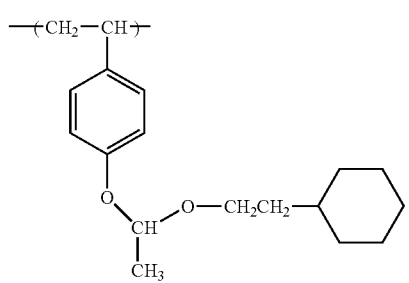

-continued (B-34) 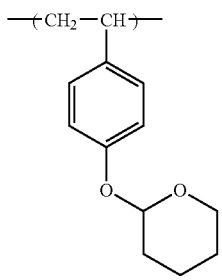

(B-35) 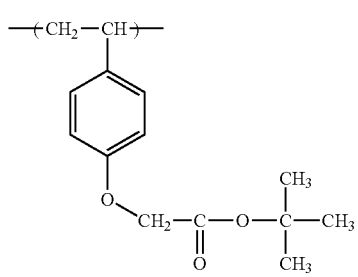

(B-36) 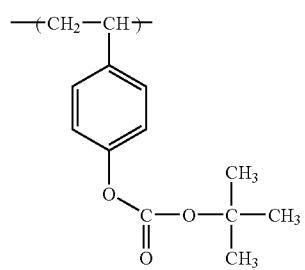

Each repeating unit shown above may be used individually or in combination of two or more thereof.

A preferable range of the molecular weight of the resin (A) of the invention comprising the repeating units enumerated heretofore is from 1,000 to 200,000, and more preferably from 3,000 to 20,000 in terms of weight-averaged value. The distribution of the molecular weight (weight average molecular weight/number average molecular weight) lies in the range of 1 to 10, preferably 1 to 3, and more preferably 1 to 2. Resins having a narrower molecular weight distribution exhibit a better resolution, more desirable resist configurations and smoother side walls in the resist pattern. Based on the total solid content of the composition, the resin in (A) of the invention is used at a content of 50 to 99.5% by weight, preferably 60 to 98% by weight, and more preferably 65 to 95% by weight.

[2] Compound Capable of Generating an Acid upon the Irradiation with Actinic Ray or Radiation As the compounds generating an acid by the irradiation of active light or radio-active rays, one can appropriately select from the photo-initiators for cationic photo-polymerization, the photo-initiators for radical photo-polymerization, photo-quenchers as well as photo-color modifiers for dyes, and the known compounds that generate an acid by the action of various kinds of light (including UV light of a 400 to 200 nm wavelength, deep UV light, and in particular the g line, h line and i line light and KrF excimer laser light), ArF excimer laser light, electron beams, X-rays, molecular beams and ion beams.

Other compounds that generate an acid by the irradiation of an active light or radio-active rays include, for example, the diazonium salts set forth in S. I. Schlesinger, Photogr. Sci. Eng., 18, 387 (1974) and T. S. Bal et al, Polymer, 21, 423 (1980); the ammonium salts set forth in U.S. Pat. Nos. 4,069,055, 4,069,056 and Re 27,992, and Japanese Patent Laid-Open No. 140, 140/1991; the phosphonium salts set forth in D. C. Necker et al, Macromolecules, 17, 2,468 (1984), C. S. Wen et al, Teh Proc. Conf. Rad. Curing ASIA, p. 478, Tokyo, (Oct., 1988) and U.S. Pat. Nos. 4,069,055 and 4,069,056; the iodonium salts set forth in J. V. Crivello et al, Macromolecules, 10 (6), 1307 (1977), Chem. & Eng. News, Nov.28, p.31 (1988), EP Nos. 104,143, 339,049 and 410,201 and Japanese Patent Laid-Open Nos. 150,848/1990 and 296,514/1990; the sulfonium salts set forth in J. V. Crivello et al, Polymer J. 17, 73 (1985), J. V. Crivello et al., J. Org. Chem., 43, 3055 (1978), W. R. Watt et al, J. Polymer Sci., Polymer Chem. Ed., 22, 1789 (1984), J. V. Crivello et al, Polymer Bull., 14, 279 (1985), J. V. Crivello et al, Macromolecules, 14 (5), 1141 (1981), J. V. Crivello et al, J. Polymer Sci., Polymer Chem. Ed., 17, 2877 (1979), EP Nos. 370,693, 161,811, 410,201, 339,049, 233,567, 297,443 and 297,442, U.S. Pat. Nos. 4,933,377, 3,902,114, 4,760,013, 4,734,444 and 2,833,823, Ger. P. Nos. 2,904,626, 3,604,580 and 3,604,581; the selenonium salts set forth in J. V. Crivello et al, Macromolecules, 10 (6), 1307 (1977), Crivello et al, J. Polymer Sci., Polymer Chem. Ed., 17, 1047 (1979); the arsonium salts set forth in C. S. Wen et al, Teh Proc. Conf. Rad. Curing ASIA, p. 478, Tokyo, (Oct., 1988); the organic halogen compounds set forth in U.S. Pat. No. 3,905,815, Japanese Patent Publication No. 4,605/1971, Japanese Patent Laid-Open Nos. 36,281/1973, 32,070/1980, 239,736/1985, 169,835/1986, 169,837/1986, 58,241/1987, 212,401/1987, 70,243/1988 and 298,339/1988; the organic metal/organic halogen compounds set forth in K. Meier et al, J. Rad. Curing, 13 (4), 26 (1986), T. P. Gill et al, Inorg. Chem., 19, 3007 (1980), D. Astruc, Acc. Chem. Res., 19 (12), 377 (1896), Japanese Patent Laid-Open No. 161,445/1990; the photo acid-generating agents protected by an o-nitrobenzyl group set forth in Hayase et al, J. Polymer Sci., 25, 753 (1987), E. Reichmanis et al, J. Polymer Sci., Polymer Chem. Ed., 23, 1 (1985), Q. Q. Zhuetal, J. Photochem., 36, 85, 39, 317 (1987), B. Amit et al, Tetrahedron Lett., (24) 2205 (1973), D. H. R. Barton et al, J. Chem. Soc., 3571 (1965), P. M. Collins et al, J. Chem. Soc., Perkin I. 1695 (1975), M. Rudinstein et al, Tetrahedron Lett., (17), 1445 (1975), J. W. Walker et al, J. Am. Chem. Soc., 110, 7170 (1988), S.C. Busman et al., J. Imaging Technol., 11 (4), 191 (1985), H. M. Houlihan et al, Macromolecules, 21, 2001 (1988), P. M. Collins et al, J. Chem. Soc., Chem. Commun., 532 (1972), S. Hayase et al, Macromolecules, 18, 1799 (1985), E. Reichmanis et al, J. Electrochem. Soc., Solid State Sci. Technol., 130 (6), F. M. Houlihan et al, Macromolecules, 21, 2001 (1988), EP Nos. 0290,750, 046,083, 156,535, 271,851 and 388,343, U.S. Pat. Nos. 3,901,710 and 4,181,531, and Japanese Patent Laid-Open Nos. 198,538/1985 and 133,022/1978; the compounds that generate sulfonic acid by photodecomposition typified by iminosulfonate set forth in M. Tunooka et al, Polymer Preprints Japan, 35 (8), G. Berner et al, J. Rad. Curing, 13 (4), W. J. Mijs et al, Coating Technol., 55 (697), 45 (1983), Akzo, H. Adachi et al, Polymer Preprints, Japan, 37 (3), EP Nos. 0199,672, 84,515, 44,115, 618,564 and 0101,122, U.S. Pat. Nos. 4,371,605 and 4,431, 774, and Japanese Patent Laid-Open Nos. 18,143/1989, 245,756/1990 and 140,109/1991; and the disulfone compounds set forth in Japanese Patent Laid-Open No. 166,544/1986.

Further, polymeric compounds to the main-chain or side-chain of which the group or compound generating an acid by the irradiation of an active light or radio-active rays such as cited above is introduced can be used including those set forth in, for example, M. E. Woodhouse et al, J. Am. Chem. Soc., 104, 5586 (1982), S. P. Pappas et al, J. Imaging Sci., 30 (5), 218 (1986), S. Kondo et al, Makromol. Chem., Rapid Commun., 9, 625 (1988), Y. Yamada et al, Makromol. Chem., 152, 153 and 163 (1972), J. V. Crivello et al, J. Polymer Sci., Polymer Chem. Ed., 17, 3845 (1979), U.S. Pat. No. 3,849,137, Ger. P. No. 3,914,407, and Japanese Patent Laid-Open Nos. 26,653/1988, 164,824/1980, 69,263/1987, 146,038/1988, 163,452/1988, 153,853/1987 and 146,029/1988.

Moreover, those compounds which generate an acid by the action of light and are set forth in the following references can also be used: V. N. R. Pillai, Synthesis, (1), 1 (1980), A. Abad et al, Tetrahedron Lett., (47) 4555 (1971), D. H. R. Barton et al, J. Chem. Soc., (C), 329 (1970), U.S. Pat. No. 3,779,778 and EP No. 126,712.

Among the compounds enumerated above which decompose by the irradiation of an active light or radio-active rays to generate acid, those which are used especially efficiently are described hereinafter.

(1) Oxazol derivatives represented by the following general formula PAG1 in which a trihalomethyl group is substituted, or S-triazine derivatives represented by general formula PAG2.

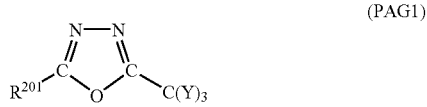

(PAG1)

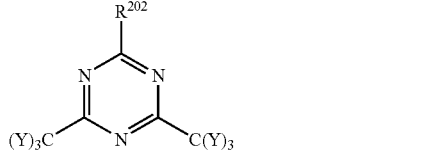

(PAG2)

In the formulae, $R^{201}$ represents a substituted or unsubstituted aryl or alkenyl group, $R^{202}$ represents a substituted or unsubstituted aryl, alkenyl or alkyl group, or —C(Y)$_3$. Y represents a chlorine or bromide atom.

Some specific examples are given below not to restrict the scope of the invention thereto.

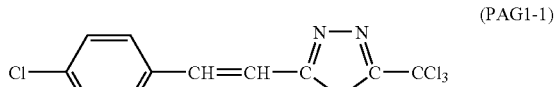

(PAG1-1)

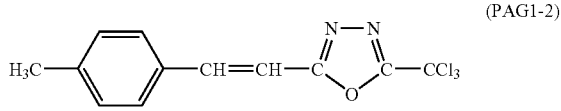

(PAG1-2)

-continued
(PAG1-3)
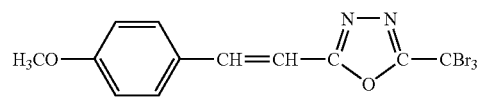
(PAG1-4)
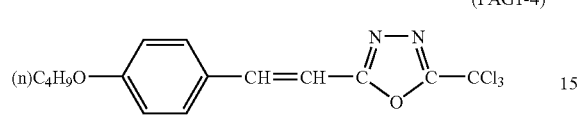
(PAG1-5)
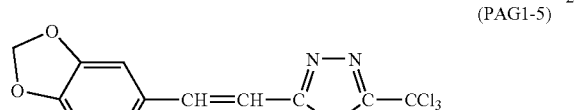
(PAG1-6)
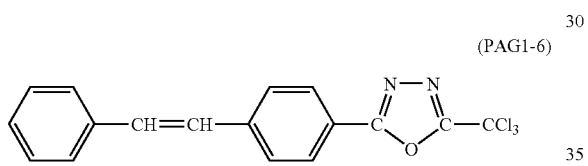
(PAG1-7)
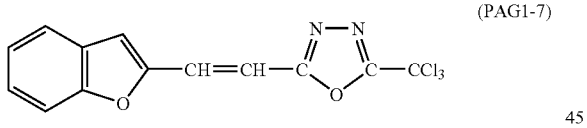
(PAG1-8)
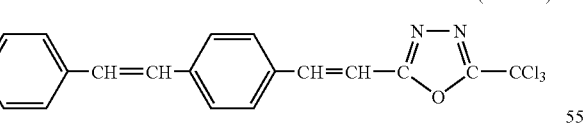
(PAG2-1)
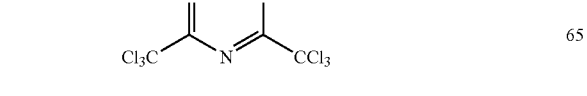
-continued
(PAG2-2)
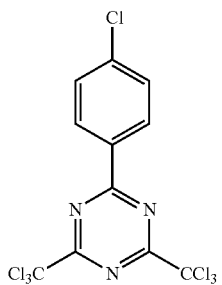
(PAG2-3)
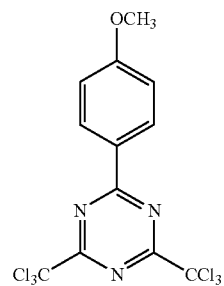
(PAG2-4)
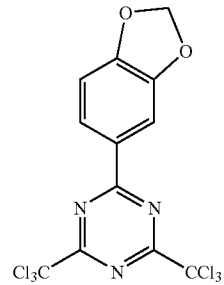
(PAG2-5)
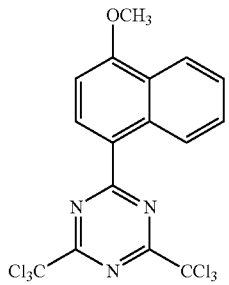
(PAG2-6)
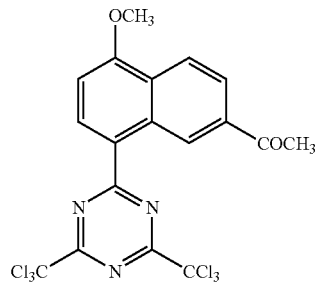

-continued (PAG2-7)
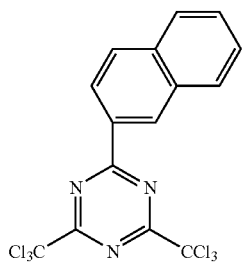

(PAG2-8)
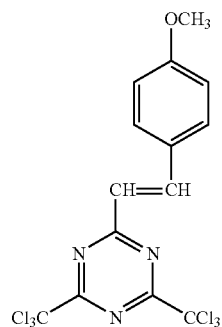

(PAG2-9)
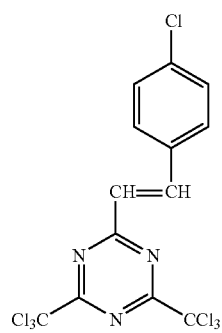

(PAG2-10)
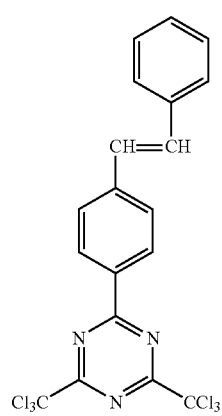

(2) The iodonium salts represented by the following general formula PAG3, or the sulfonium salts represented by general formula PAG4.

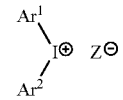
(PAG3)

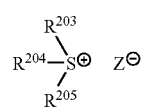
(PAG4)

In the formulae, $Ar^1$ and $Ar^2$ each independently represents a substituted or unsubstituted aryl group. Preferable substituents include an alkyl group, a haloalkyl group, a cycloalkyl group, an aryl group, an alkoxy group, nitro group, a carboxyl group, an alkoxycarbonyl group, hydroxy group and a mercapto group and a halogen atom.

$R^{203}$, $R^{204}$ and $R^{203}$ each independently represents a substituted or unsubstituted alkyl or aryl group. Aryl groups with 6 to 14 carbon atoms, alkyl groups with 1 to 8 carbon atoms and their substituted derivatives are preferred. Preferred substituents for the aryl group include an alkoxy group of 1 to 8 carbon atoms, an alkyl group of 1 to 8 carbon atoms, a cycloalkyl group, nitro group, a carboxyl group, a mercapto group, hydroxy group and a halogen atom. On the other hand, those for the alkyl group include an alkoxy group of 1 to 8 carbon atoms, a carboxyl group and an alkoxycarbonyl group.

$Z^-$ represents an anion, specifically including the anions of a substituted or unsubstituted alkylsulfonic, cycloalkylsulfonic, perfluoroalkylsulfonic and arylsulfonic acid (for example, benzenesulfonic, naphthalenesulfonic or anthracenesulfonic acid which may be substituted).

$Z^-$ preferably represents an anion of a perfluoroalkylsulfonic acid having at least two carbon atoms, perfluoroarylsulfonic acid or arylsulfonic acid substituted by perfluoroalkyl group.

The alkyl group in $Z^-$ may be straight chain, branched or cyclic. The alkyl group in $Z^-$ preferably has 2 to 10 carbon atoms, and specifically includes ethyl, n-propyl, i-propyl, n-butyl, i-butyl, t-butyl, n-amyl, i-amyl, t-amyl, n-hexyl, cyclohexyl, n-octyl, 2-ethylhexyl, n-nonyl or n-decanyl group. The alkyl may have a substituent including halogen atom, cyano group, nitro group, straight chain, branched or cyclic alkoxy group having 1 to 6 carbon atom. The aryl group in $Z^-$ preferably has 6 to 14 carbon atoms, and specifically includes phenyl, naphtyl or anthryl group. The aryl group may has a substituent including halogen atom, cyano group, nitro group, straight chain, branched or cyclic alkyl group having 1 to 6 carbon atom, or straight chain, branched or cyclic alkoxy group having 1 to 6 carbon atom.

Furthermore, two of $R^{202}$, $R^{204}$ and $R^{205}$ or $Ar^1$ and $Ar^2$ may combine together via a single bond or a substituent.

Specific examples are enumerated below, but the scope of the invention is not restricted to those at all.

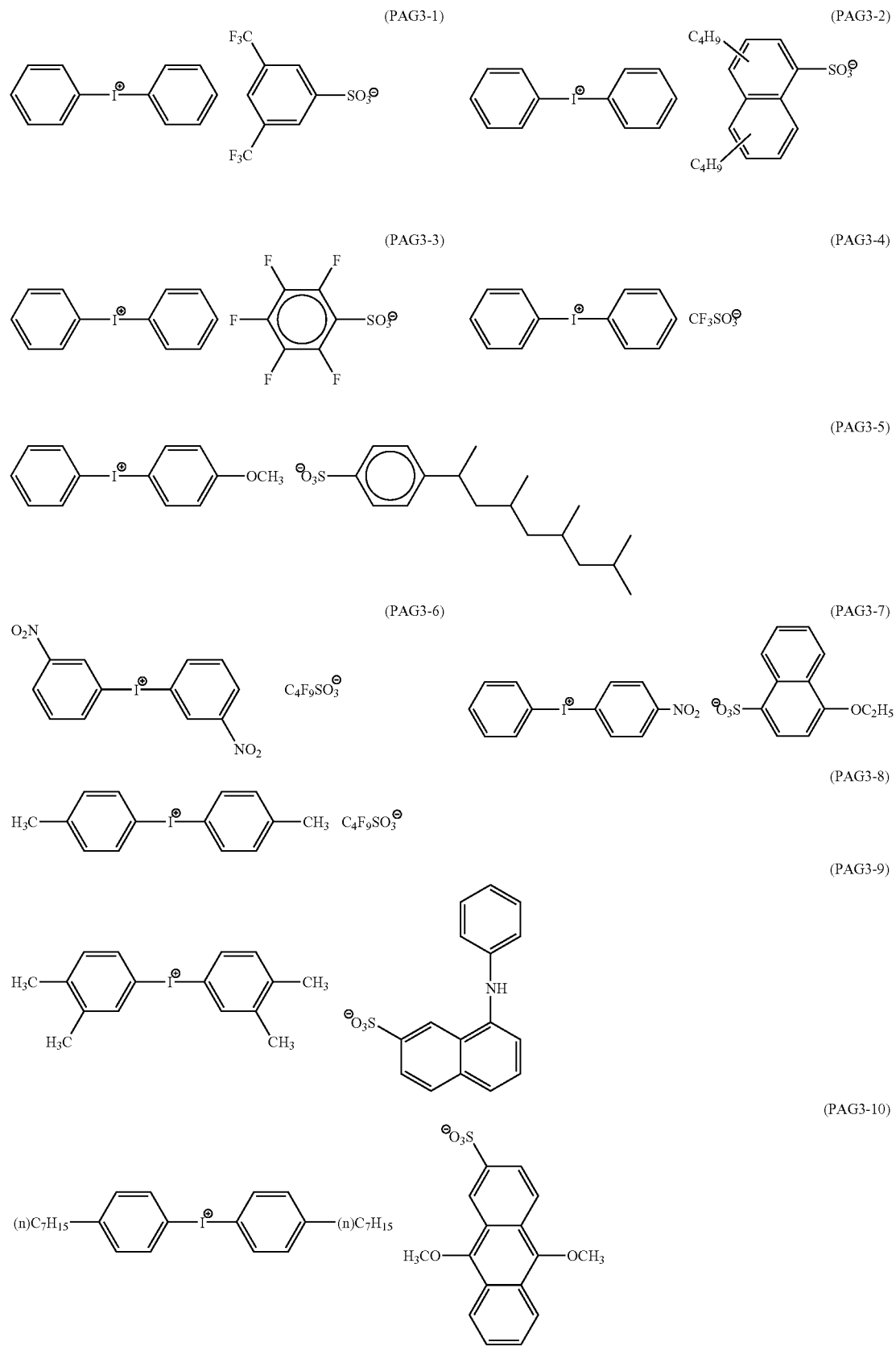

-continued
(PAG3-11)
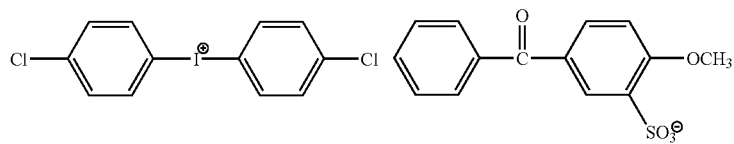
(PAG3-12)
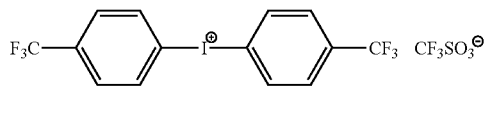
(PAG3-13)
(PAG3-14)
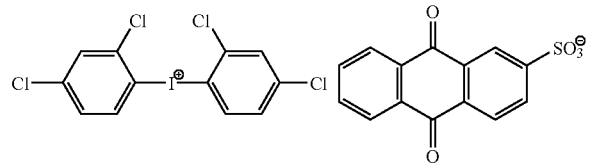
(PAG3-15)
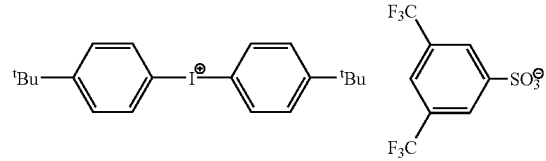
(PAG3-16)
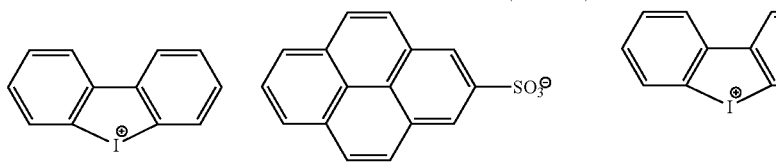
(PAG3-17)
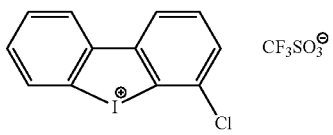
(PAG3-18)
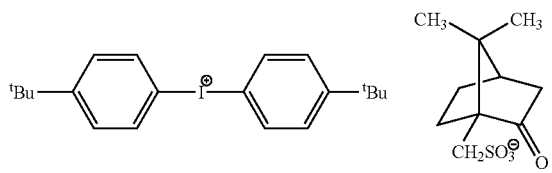
(PAG3-19)
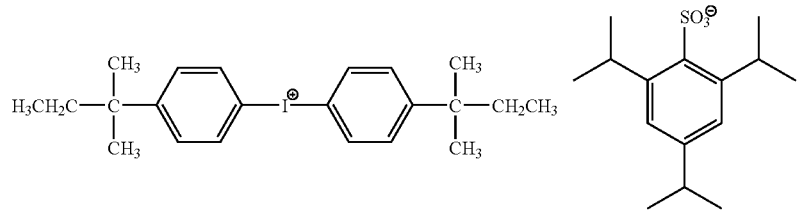
(PAG3-20)
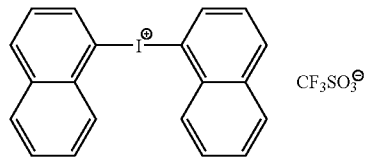
(PAG3-21)
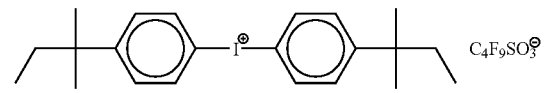
(PAG3-22)
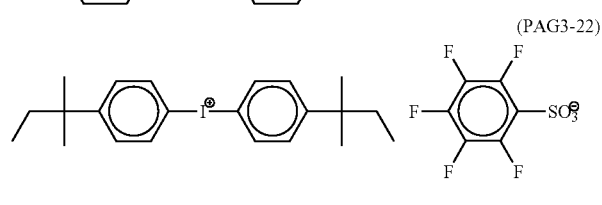
(PAG4-1)
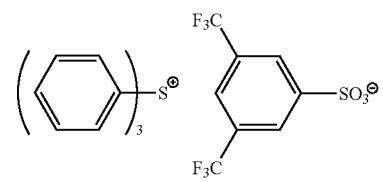

-continued
(PAG4-2) 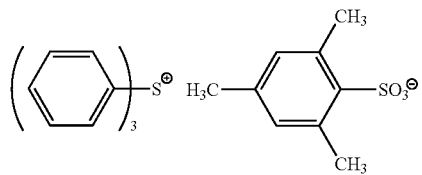
(PAG4-3) 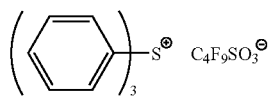
(PAG4-4) 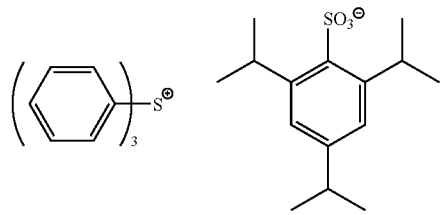
(PAG4-5) 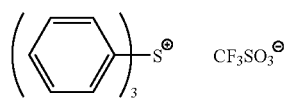
(PAG4-6) 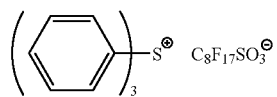
(PAG4-7) 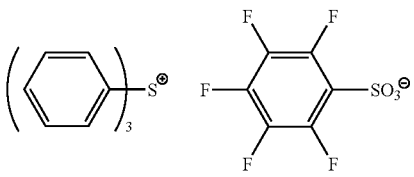
(PAG4-8) 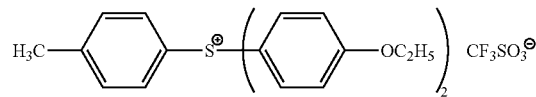
(PAG4-9) 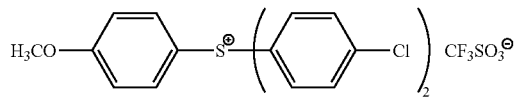
(PAG4-10) 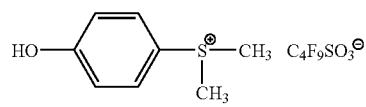
(PAG4-11) 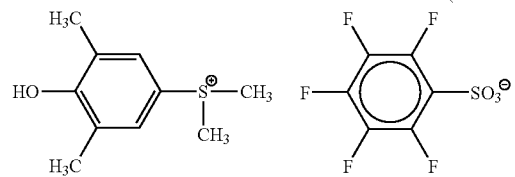
(PAG4-12) 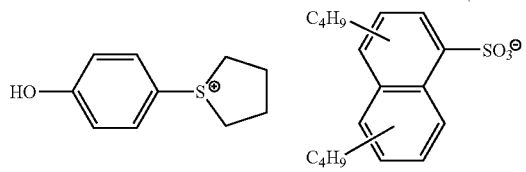
(PAG4-13) 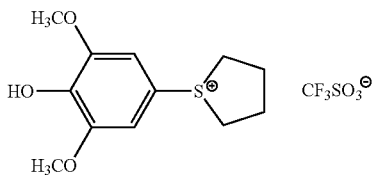
(PAG4-14) 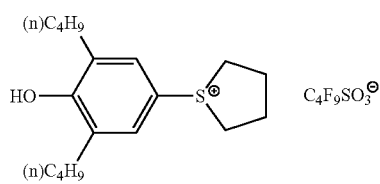
(PAG4-15) 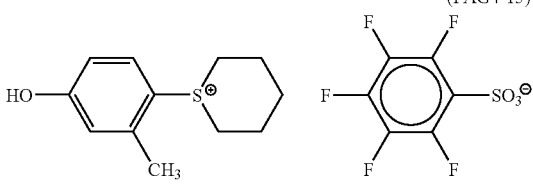
(PAG4-16) 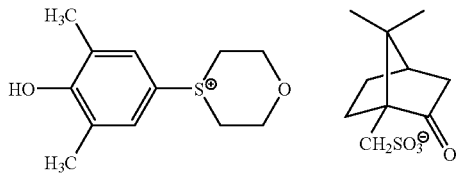
(PAG4-17) 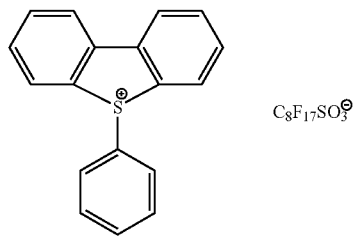

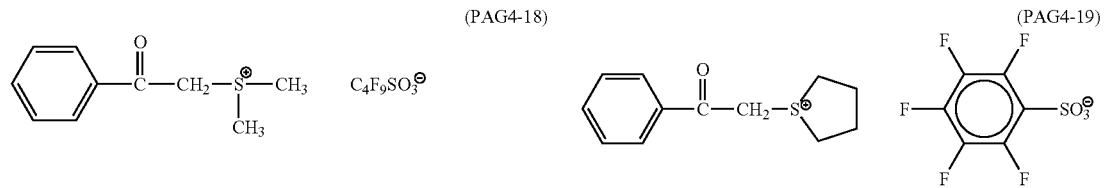
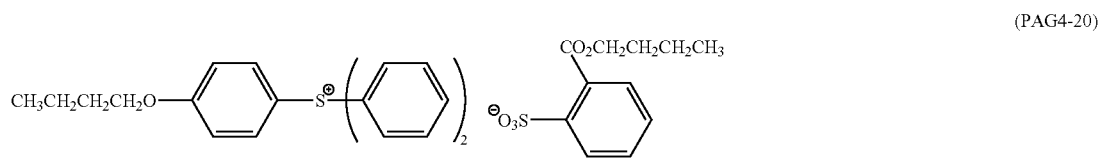
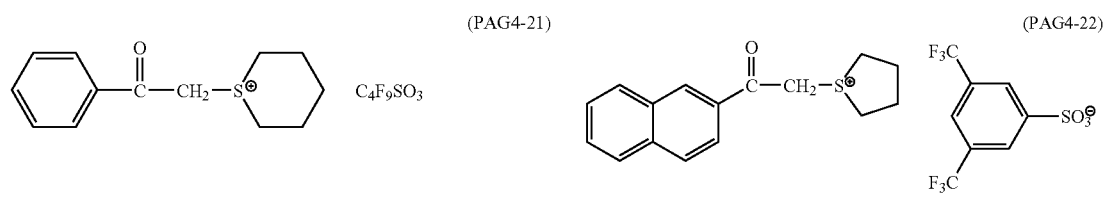
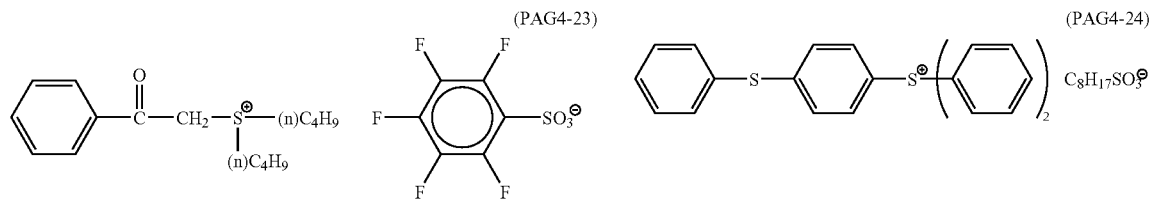
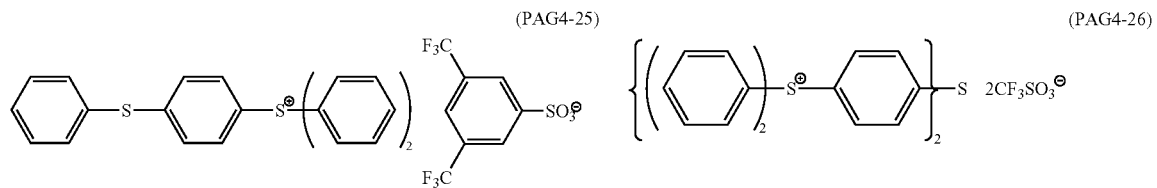
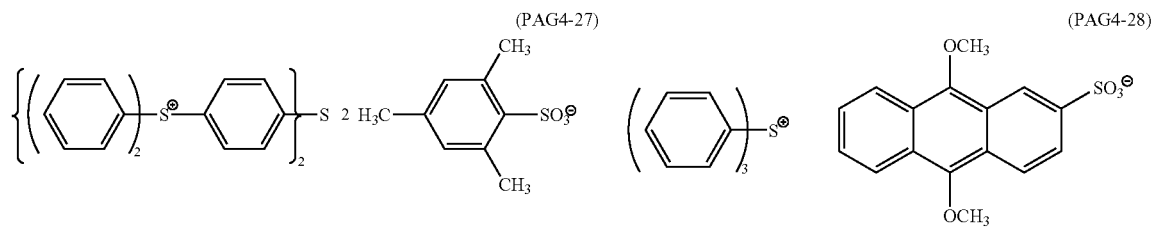

-continued

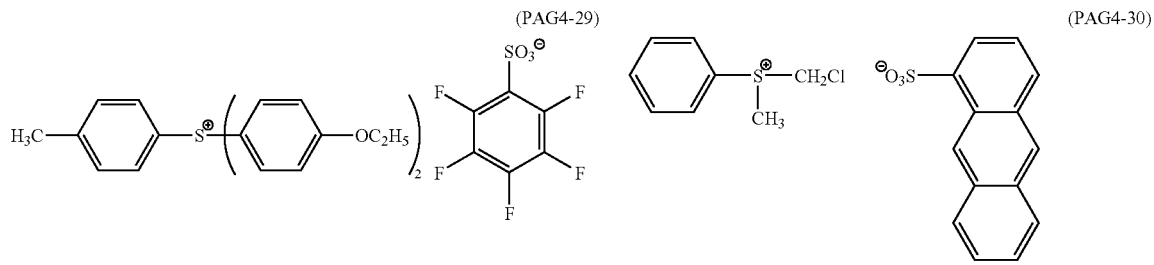

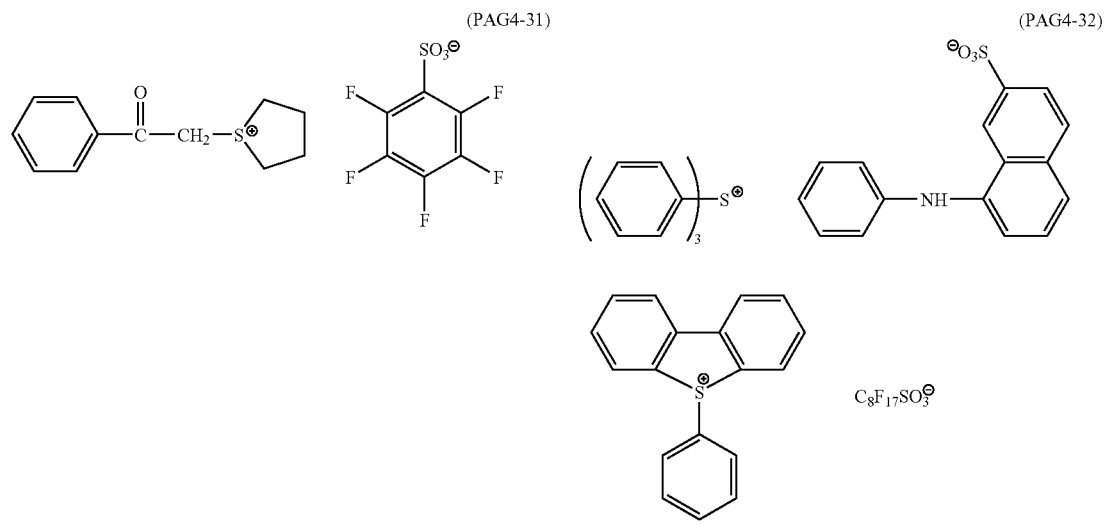

The onium salts represented by general formulae PAG3 and PAG4, which are well known in the art, can be prepared by the synthetic methods described in, for example, J. W. Knapczyk et al, J. Am. Chem. Soc., 91, 145 (1969), A. L. Maycok et al, J. Org. Chem., 35, 2532 (1970), E. Goethas et al, Bull. Soc. Chem. Belg., 73, 546 (1964), H. M. Leicester, J. Am. Chem. Soc., 51, 3587 (1929), J. V. Crivello et al, J. Polym. Chem. Ed., 18, 2677 (1980), U.S. Pat. Nos. 2,807,648 and 4,247,473 and Japanese Patent Laid-Open No. 101331/1978.

(3) The disulfone derivatives represented by the following general formula PAG5 or the imide-N-sulfonate derivatives represented by general formula PAG6.

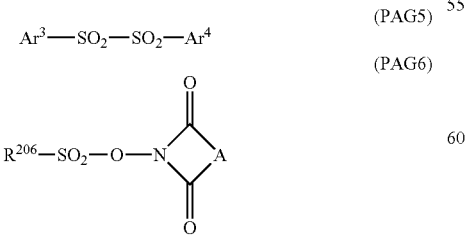

In the formulae, $Ar^3$ and $Ar^4$ each independently represents a substituted or unsubstituted aryl group. $R^{206}$ represents a substituted or unsubstituted alkyl or aryl group. A represents a substituted or unsubstituted alkylene, alkenylene or arylene group.

Some specific examples will be shown below not to restrict the scope of the invention thereto.

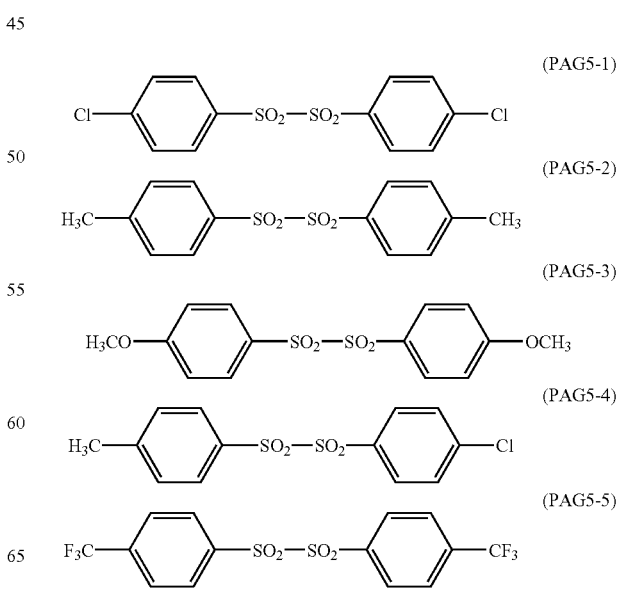

-continued (PAG5-6) (PAG5-7) (PAG5-8) (PAG5-9) (PAG5-10) (PAG5-11) (PAG5-12) (PAG5-13) (PAG5-14) (PAG5-15)

-continued (PAG6-1) (PAG6-2) (PAG6-3) (PAG6-4) (PAG6-5) (PAG6-6) (PAG6-7) (PAG6-8)

(PAG6-9)
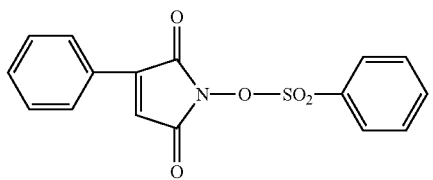
(PAG6-10)
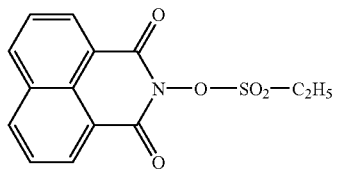
(PAG6-11)
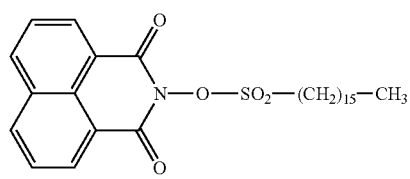
(PAG6-12)
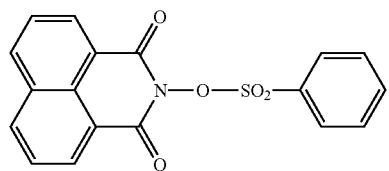
(PAG6-13)
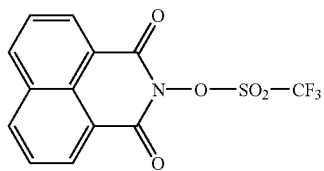
(PAG6-14)
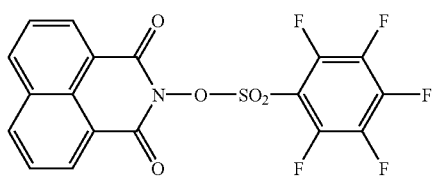
(PAG6-15)
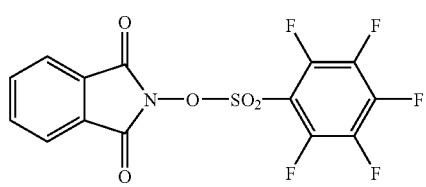
(PAG6-16)
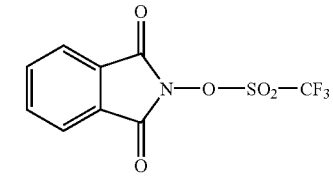
(PAG6-17)
(PAG6-18)
(PAG6-19)
(PAG6-20)
(4) The diazodisulfone derivatives represented by the following general formula PAG7.
(PAG7)
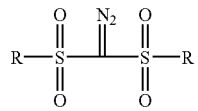
R in the formula represents a linear, branched-chain or cyclic alkyl group that may be substituted.
Some specific examples are shown below not to restrict the scope of the invention thereto.
(PAG7-1)
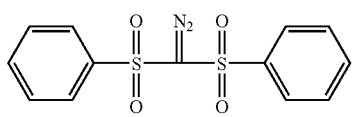
(PAG7-2)
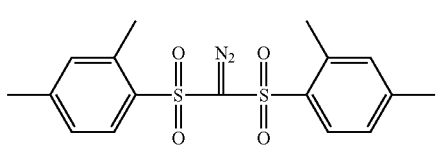

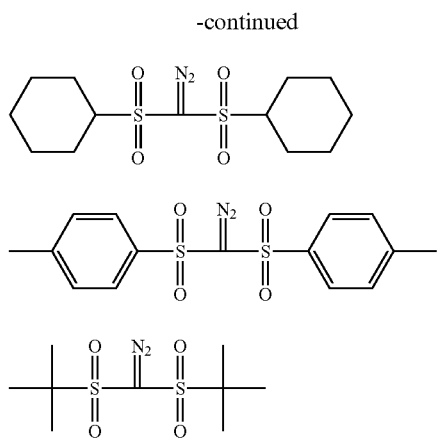

(PAG7-3)

(PAG7-4)

(PAG7-5)

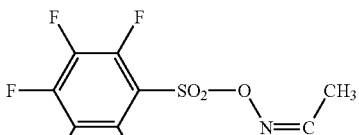

(PAG8-4)

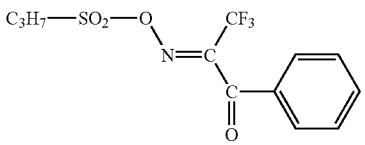

(PAG8-5)

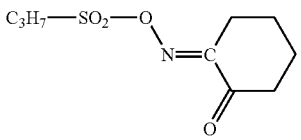

(PAG8-6)

(5) The oxime-N-sulfonate derivatives represented by the following general formula PAG8.

$$R_{207}\text{—}SO_2\text{—}O\text{—}N{=}C(R_{208})(R_{209})$$ (PAG8)

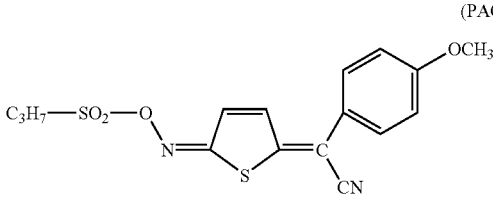

(PAG8-7)

In the formula, $R_{207}$ represents a substituted or unsubstituted alkyl, cycloalkyl, aryl, aralkyl group. $R_{208}$ and $R_{209}$ each represents a substituted or unsubstituted alkyl, cycloalkyl, aryl, aralkyl, cyano or acyl group. $R_{208}$ and $R_{209}$ may combine together to form a carbocyclic ring or a heterocycylic ring including an oxygen, nitrogen or sulfur atom.

In the following, some specific examples are enumerated not to restrict the scope of the invention thereto at all.

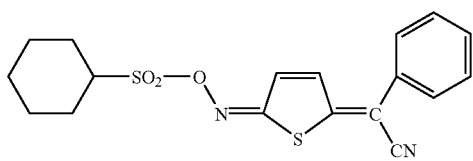

(PAG8-8)

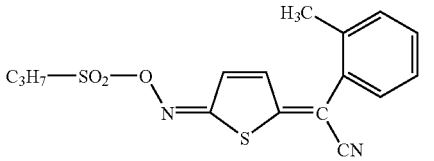

(PAG8-9)

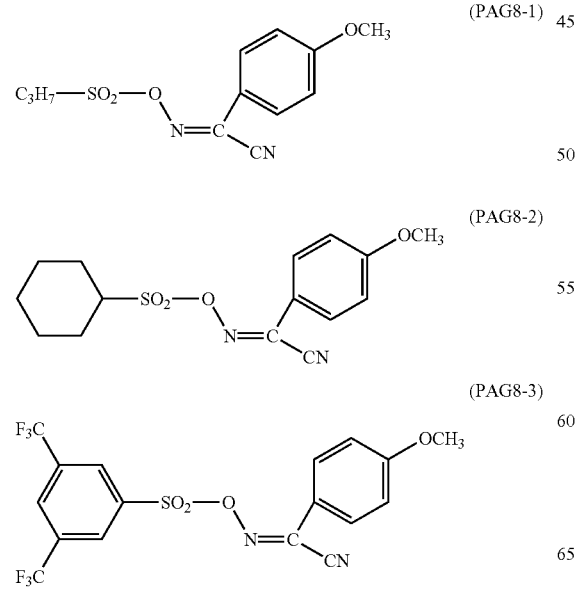

(PAG8-1)

(PAG8-2)

(PAG8-3)

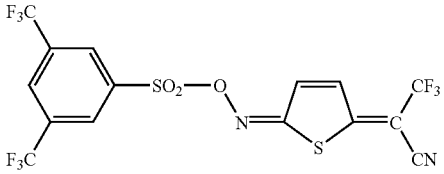

(PAG8-10)

The added amount of the compound in (B) of the invention that generates an acid by the irradiation of an active light or radioactive ray lies in the range of 0.1 to 20% by weight, preferably 0.5 to 10% by weight, and more preferably 1 to 7% by weight based on the total solid content of the composition of the invention. These compounds may be used individually or in combination of two or more thereof.

[3] Acid Diffusion-suppressing Agent (C) of the Invention

The composition of the invention preferably includes an acid diffusion-suppressing agent in order to prevent the performance shift caused not only by the time elapsed after the exposure to an active light or radio-active ray till the post-baking (expressed by the formation of a T-top cross-section, sensitivity fluctuation or pattern line width fluctuation), but also by the time elapse after coating, and to suppress an excessive diffusion of acid during post-baking (which leads to the deterioration of pattern resolution). The acid diffusion-suppressing agent usually comprises an organic basic compound such as, for example, those containing a basic nitrogen. A compound whose conjugated acid has a pKa value of not less than 4 is preferably used.

Specifically, compounds having the following partial structures represented by the following general formulae (A) to (E) are preferably employed.

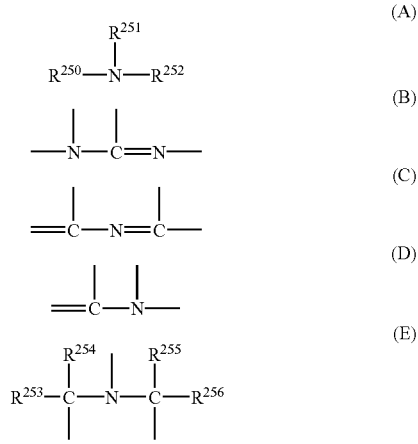

In the formulae, $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, and a substituted or unsubstituted aryl group having 6 to 20 carbon atoms. Here, $R^{251}$ and $R^{252}$ may combine together to form a ring.

$R^{253}$, $R^{254}$, $R^{255}$ and $R^{256}$, which maybe the same or different, each represents an alkyl group having 1 to 6 carbon atoms.

More preferable compounds are nitrogen-containing basic compounds having two or more nitrogen atoms each lying in different chemical environments within a single molecule. Particularly preferable compounds are those containing a substituted or unsubstituted amino group together with a cyclic structure including a nitrogen atom, or those containing an alkylamino group.

Specific examples of preferable compounds include substituted or unsubstituted guanidines, substituted or unsubstituted aminopyridines, substituted or unsubstituted aminoalkylpyridines, substituted or unsubstituted aminopyrrolidines, substituted or unsubstituted indazoles, imidazole, substituted or unsubstituted pyrazolines, substituted or unsubstituted pyrazines, substituted or unsubstituted pyrimidines, substituted or unsubstituted purines, substituted or unsubstituted imidazolines, substituted or unsubstituted pyrazoles, substituted or unsubstituted piperazines, substituted or unsubstituted aminomorpholines and substituted or unsubstituted aminoalkylmorpholine. Preferable substituents include an amino group, an aminoalkyl group, an alkylamino group, an aminoaryl group, an arylamino group, an alkyl group, an alkoxy group, an acyl group, an acyloxy group, an aryl group, an aryloxy group, nitro group, hydroxy group and cyano group.

Particularly preferable compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperadine, N-(2-aminoethyl)piperadine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, the scope of the invention is not restricted to those, since still other compounds can be also used.

These nitrogen-containing compounds may be used individually or in combination of two or more thereof.

The use ratio of the acid-generating agent and the organic basic compound in the composition should preferably lie in the range of 2.5 to 300 in the molar ratio of (acid-generator)/(organic basic compound). In the case where this molar ratio is below 2.5, pattern resolution sometimes deteriorates, while, over 300, resist patterns tend to fatten, resulting in resolution deterioration caused by the time elapsing after exposure till post-baking. The molar ratio of (acid-generator)/(organic basic compound) is preferably 5.0 to 200, and more preferably 7.0 to 150.

[4] Surfactant Containing at Least One of a Fluorine Atom and a Silicone Atom, Applicable to the Composition of the Invention The positive resist composition of the invention can include a Surfactant containing at least one of a fluorine atom and a silicone atom. More specifically, the positive resist composition of the invention can contain one or more compounds selected from the group comprising fluorine-containing surfactants, silicone atom containing surfactants and those containing both of fluorine and silicon atoms. The surfactant act(s) to suppress the generation of development defect and improve coating performance.

As such surfactants, those set forth, for example, in the following patents can be used. Japanese Patent Laid-Open Nos. 36,663/1987, 226,746/1986, 226,745/1986, 170,950/1987, 34,540/1988, 230,165/1995, 62,834/1996, 54,432/1997 and 5,988/1997, U.S. Pat. Nos. 5,405,720, 5,360,692, 5,529,881, 5,296,330, 5,436,098, 5,576,143, 5,296,143, 5,294,511 and 5,824,451. Moreover, the following commercially available surfactants can be used as they are.

Fluorine-containing or silicone-based surfactants such as Eftop EF301, EF303 and EF352 (all being products of Shin Akita Kasei Co., Ltd.), Florad FC430 and 431 (both being products of Sumitomo 3M, Ltd.), Megafac F171, F173, F176, F189 and R08 (all being products of Dainippon Ink and Chemicals, Inc.), Asahi Guard AG710, Surflon S-382, SC101, 102, 103, 104, 105 and 106, (all being products of Asahi Glass Co., Ltd.), Troysol S-366 (a product of Troy Chemical Industries, Inc.). A polysiloxane KP-341 (made by Shin-Etsu Chemical Co., Ltd.) can also be used as a silicon-based surfactant.

Such surfactants are added at an amount of usually 0.001 to 2% by weight, preferably 0.01 to 1% by weight of the total solid content in the composition of the invention. These surfactants may be used individually or in combination of two or more thereof.

[5] Other Ingredients Used in the Composition of the Invention (2) Solvent

The composition of the invention is dissolved in a solvent that can solve all the ingredients described heretofore, and the resulting solution is coated on a substrate. The solvent material used for such a purpose includes ethylene dichloride, cyclohexanone, cyclopentanone, 2-heptanone, γ-butylolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These compounds may be used individually or as mixtures.

In the manufacture of precise LSI's, pattern formation in a resist film is performed by first coating the positive resist composition on a substrate (exemplified by a silicon/silicon dioxide film, a transparent support such as a glass plate and an ITO plate), then irradiating an active light or a radioactive ray with use of a pattern exposing apparatus, and thereafter conducting post-baking, developing, rinsing and drying.

The developer for the positive resist of the invention comprises an aqueous solution of an basic compound including inorganic basic compounds such as sodium hydroxide, potassium hydroxide, sodium carbonate, sodium silicate, sodium metasilicate and aqueous ammonia, and organic ones such as primary amines exemplified by ethylamine and n-propylamine, secondary amines exemplified by diethylamine and di-n-butylamine, quaternary amines exemplified by triethylamine and methyldiethylamine, alcohol amines exemplified by dimethylethanolamine and triethanolamine, quaternary ammonium salts exemplified by tetramethylammonium hydroxide, tetraethylammonium hydroxide and choline, and cyclic amines exemplified by pyrole and piperidine. The aqueous alkaline solution enumerated above can further contain an alcohol such as isopropyl alcohol and a surfactant such as nonionic one at an appropriate amount.

Among the basic compounds mentioned above, quaternary ammonium salts are preferred, and tetramethylammonium hydroxide and choline are still more preferred for the developer.

More detailed descriptions of the invention will follow with reference to some examples, but the scope of the invention is not limited to the examples at all.

SYNTHETIC EXAMPLE 1

Into 60 ml 1-methoxy-2-propanol were dissolved 13.5 g (0.05 mol) of 4-[bis(trifluoromethyl)-hydroxymethyl] styrene and 3.4 g (0.05 mol) of methacrylonitrile. Further 0.25 g of 2,2'-azobis(2,4-dimethylvalelonitrile) (with a trade name V-65, made by Wako Pure Chemical Industries, Ltd.) was added as a polymerization initiator. The resulting solution was added dropwise over the period of 2 hours along with the injection of nitrogen gas into 10 ml of 1-methoxy-2-propanol kept at 70° C. After the completion of the addition, the mixture was agitated for additional 4 hours. The reaction mixture was poured into one liter of a mixture of methanol and ion-exchanged water (1/1) under vigorous stirring. The deposited resinous product was washed with ion-exchanged water, filtered and then dried under vacuum to give 14.8 g of a white resin. An NMR measurement confirmed that the product has a polymer structure represented by (I-1)/(III-2)=52/48 defined hereinabove, and a GPC measurement proved that the resin has a weight-averaged molecular weight (polystyrene-based) of 8,900. This resin was dissolved in 100 ml THF, to which 2.9 g (0.04 mol) of ethyl vinyl ether and a catalytic quantity of p-toluenesulfonic acid were added. The resulting reaction mixture was agitated at room temperature for 8 hours. Then, the reaction was terminated by adding triethylamine at an amount of twice as much as the quantity of the p-toluenesulfonic acid catalyst. The reaction product was poured into 3 liters of ion-exchanged water under vigorous stirring. The deposit formed was separated by filtration and dried to give 15.3 g of Resin (1) of the invention. A GPC measurement determined the weight-averaged molecular weight of Resin (1) to be 9,100. Further, the composition of Resin (1) was identified as (I-1)/(I-4)/(III-2)=10/42/48 by H-NMR, C-NMR and IR measurements.

By repeating similar procedures, the resins of the invention shown in Table 1 were synthesized.

[Table 1]

TABLE 1

Synthesis of Resin (A) of the Invention

| Resin (A) | Composition (Structural Unit and Molar Ratio) | Molecular Weight |
| --- | --- | --- |
| (2) | (I-1)/(I-7)/(III-2) = 9/43/48 | 9,900 |
| (3) | (I-3)/(III-2) = 53/47 | 10,700 |
| (4) | (I-10)/(III-2) = 54/46 | 11,200 |
| (5) | (I-1)/(I-11) = 39/61 | 13,400 |
| (6) | (I-1)/(I-12)/(III-6) = 10/48/42 | 8,700 |
| (7) | (I-14)/(III-2) = 51/49 | 9,400 |
| (8) | (I-20)/(III-2)/(V-5) = 51/32/17 | 11,700 |
| (9) | (I-1)/(I-12) = 34/64 | 10,300 |
| (10) | (I-1)/(I-21)/(B-31) = 32/51/17 | 8,500 |
| (11) | (I-1)/(I-27)/(III-2) = 11/46/43 | 9,700 |
| (12) | (I-1)/(I-15)/(B-7) = 18/51/31 | 11,900 |

EXAMPLE 1

Measurement of Transmittance

As for Resins (1) to (6), a resist composition of the invention was prepared by dissolving 1.36 g of each resin, 0.02 g of the nonaflate salt of triphenylsulfonium (PAG4-3) and 0.02 g of an imidosulfonate compound (PAG6-19) in 8.5 g of propylene glycol monomethyl ether acetate, and then adding, to the solution, 0.005 g of dicyclohexylmethylamine and 0.01 g of Megafac R08 (made by Dainippon Ink and Chemicals, Inc.) as a fluorine-containing surfactant. As for Resins (7) to (12), a resist composition of the invention was prepared by dissolving 1.36 g of each resin, 0.04 g of the nonaflate salt of triphenylsulfonium (PAG4-3) and 0.02 g of an imidosulfonate compound (PAG6-19) in 8.5 g of propylene glycol monomethyl ether acetate, and then adding, to the solution, 0.005 g of dicyclohexylmethylamine and 0.01 g of Megafac R08 (made by Dainippon Ink and Chemicals, Inc.) as a fluorine-containing surfactant.

After filtered through a Teflon filter of 0.1 μm pore size, the solution of each sample was coated on a calcium fluoride disk with use of a spin coater, and dried at 120° C. for 5 min to give a 0.1 μm thick resist film. The absorption of the coated film was measured with an Acton CAMS-507 spectrometer to derive the transmittance at 157 nm. The results are shown in Table 2.

[Table 2]

TABLE 2

| Resin of the Invention | Transmittance at 157 nm (%) |
|---|---|
| (1) | 46 |
| (2) | 47 |
| (3) | 48 |
| (4) | 53 |
| (5) | 55 |
| (6) | 52 |
| (7) | 56 |
| (8) | 53 |
| (9) | 57 |
| (10) | 51 |
| (11) | 45 |
| (12) | 53 |
| Comparative Example (A commercially available, acetal-based resist for KrF) | 18 |

Table 2 shows that the transmittance of the coated film obtained with the composition of the invention roughly exceeds 50%, thus it is evident that the film has a sufficiently high transmittance at 157 nm.

EXAMPLE 2

Evaluation of Coating Performance and Development Defect

A series of resist compositions of the invention were prepared as in Example 1 except that the surfactant used in Example 1 was changed to one of the following W-1 to W-4. The surfactants used are shown in Table 5.

The surfactants used are as follows.

TABLE 5

| | Surfactant |
|---|---|
| W1 | Megafac F176 (fluorine-containing, made by Dainippon Ink and Chemicals, Inc.) |
| W2 | Megafac R08 (fluorine-containing and silicon-containing, made by Dainippon Ink and Chemicals, Inc.) |
| W3 | Polysiloxane polymer KR-341 (made by Shin-Etsu Chemical Co., Ltd.) |
| W4 | Polyoxyethylene nonylphenyl ether |

After filtered through a Teflon filter of 0.1 μm pore size, the solution of each sample was coated on a silicon wafer that had been treated with hexamethyl disilazane with use of a spin coater, and dried on a vacuum contact type-hot plate kept at 110° C. for 90 sec to give a 0.3 μm thick resist film. The coated film was subjected to an image exposure with a KrF excimer stepper (FPA-3000EX5: a product of Canon, Inc.), and to post-baking carried out at 110° C. for 90 sec. Thereafter, the resist film was developed with a 0.262 N TMAH aqueous solution to give a L/S pattern with 0.5 μm.

Development defect and coating performance were evaluated as follows.

[Number of development defect]: On the resist pattern obtained by the procedures described heretofore, the number of development defect was counted with use of A KLA-2112 made by KLA Tencor Co., Ltd. The primary data value obtained was regarded as the number of development defect.

[Coating performance (Uniformity in the coated plane): Each resist solution was coated on an 8-inch silicon wafer. The same operations were conducted as described above for the formation of a resist film for the measurement of coating uniformity. The coating thickness was measured with Lambda A made by Dainippon Screen Manuf. Co., Ltd. at 36 spots that uniformly distributed crosswise along a wafer diameter.

The standard deviation of all the measured thickness values was calculated; samples in which the threefold of the standard deviation was less than 50 were expressed by O, and those in which the threefold of the standard deviation exceeded 50 were expressed by X.

The results of the evaluation are shown in Table 3.

[Table 3]

TABLE 3

| Resin of the Invention (A) | Surfactant Used | Development Defect | Coating Uniformity |
|---|---|---|---|
| (1) | W-1 | 16 | O |
| (2) | W-2 | 20 | O |
| (3) | W-3 | 23 | O |
| (4) | W-2 | 21 | O |
| (5) | W-2 | 19 | O |
| (6) | W-3 | 18 | O |
| (7) | W-1 | 22 | O |
| (8) | W-2 | 23 | O |
| (9) | W-3 | 19 | O |
| (10) | W-2 | 24 | O |
| (11) | W-1 | 23 | O |
| (12) | W-3 | 25 | O |
| (1) | None | 2000 | X |
| (1) | W-4 | 650 | X |

Table 3 indicates that the compositions of the invention including the fluorine atom and/or silicon atom-containing surfactants excel in coating uniformity and the occurrence of development defect compared to the comparative examples.

EXAMPLE 3

Evaluation of Image Formation Characteristics

Using the resin of the invention, a resist solution was prepared as in Example 1. After filtered through a Teflon filter of 0.1 μm pore size, the solution of each sample was coated on a silicon wafer that had been treated with hexamethyl disilazane with use of a spin coater, and dried on a vacuum contact type-hot plate kept at 110° C. for 90 sec to give a 0.1 μm thick resist film. On the resist film thus obtained, the dissolution contrast between the exposed and unexposed regions resulting from a 157 nm light exposure was measured with use of a laser exposure-dissolution performance analyzer (VUVES-4500, a product of Lithotech Japan) was measured.

The results are shown in Table 4.

[Table 4]

TABLE 4

| Resin of the Invention | Dissolution Contrast (tan θ) |
|---|---|
| (1) | 5.5 |
| (2) | 5.7 |
| (3) | 5.8 |
| (4) | 6.4 |
| (5) | 6.3 |
| (6) | 6.2 |
| (7) | 6.4 |
| (8) | 6.3 |
| (9) | 6.4 |
| (10) | 6.6 |
| (11) | 5.7 |
| (12) | 6.7 |
| Comparative Example 4 (A commercially available acetal-based resist for KrF) | 5.3[*1] |

[*1] The value for the exposure with KrF excimer laser (248 nm).

Table 4 clearly indicates that the composition of the invention can exhibit a dissolution contrast of the same level as that of the comparative example (the commercially available resist practically used for KrF excimer lasers), which means the composition is provided with a similar image-forming capability.

According to the invention, a positive resist composition is provided which has a desirable transmittance as well as an image-forming capability for the exposure with a light having as short a wavelength as 157 nm, and exhibits improved characteristics as regards to coating uniformity and development defect.

The entire disclosure of each and every foreign patent application from which the benefit of foreign priority has been claimed in the present application is incorporated herein by reference, as if fully set forth.

What is claimed is:

1. A positive resist composition comprising:
   (A) a resin capable of decomposing by the action of an acid to increase the solubility in an alkali developer; and
   (B) a compound capable of generating an acid upon irradiation with one of an actinic ray and a radiation,
   wherein the resin (A) contains a repeating unit represented by formula (I):

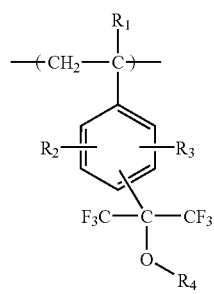

(I)

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group group which may be substituted; $R_4$ represents a hydrogen atom, an alkyl group which may be substituted, perfluoroalkyl group which may be substituted, cycloalkyl group which may be substituted, acyl group which may be substituted, alkoxycarbonyl group which may be substituted, alkoxycarbonylmethyl group which may be substituted or a group represented by formula (II):

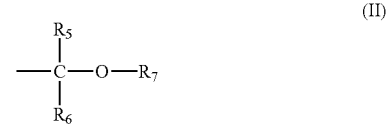

(II)

wherein $R_5$ and $R_6$, which are the same or different, each independently represents a hydrogen atom, an alkyl group which may be substituted or cycloalkyl group which may be substituted; $R_7$ represents an alkyl group which may be substituted, perfluoroalkyl group which may be substituted, cycloalkyl group which may be substituted, perfluorocycloalkyl group which may be substituted, aralkyl group which may be substituted or aryl group which may be substituted; two of $R_5$, $R_6$ and $R_7$ may combine with each other to form a ring, the positive resist composition further comprising a surfactant containing at least one of a flourine atom and a silicon atom.

2. The positive resist composition according to claim 1, wherein the resin (A) further contains a repeating unit represented by formula (III):

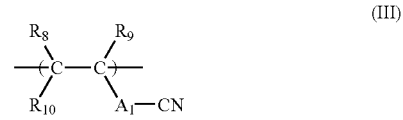

(III)

wherein $R_8$ and $R_9$, which are the same or different, each independently represents a hydrogen atom, a halogen atom, cyano group, an alkyl group which may be substituted or a haloalkyl group which may be substituted; $R_{10}$ represents a hydrogen atom, a halogen atom, an alkyl group which may be substituted, a haloalkyl group which may be substituted or a group represented by $—A_1—CN$; $A_1$ represents a single bond, an alkylene group which may be substituted, alkenylene group which may be substituted, cycloalkylene group which may be substituted or arylene group group which may be substituted, $—O—CO—R_{11}—$, $—CO—O—R_{12}—$ or $—CO—N(R_{13})—R_{14}—$; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, cycloalkyl group which may be substituted, aralkyl group which may be substituted or aryl group which may be substituted.

3. The positive resist composition according to claim 1, wherein the resin (A) further contains at least one of repeating units represented by formulae (IV) and (V):

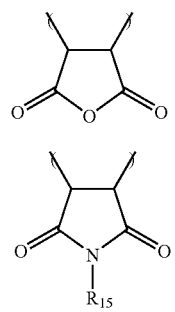

(IV)

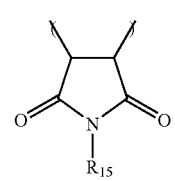

(V)

wherein $R_{15}$ represents a hydrogen atom, or an alkyl group which may be substituted, perfluoroalkyl group which may be substituted, cycloalkyl group which may be substituted, perfluorocycloalkyl group which may be substituted or aryl group which may be substituted.

4. The positive resist composition according to claim 1, wherein the resin (A) further contains at least one of repeating units represented by formulae (VI) and (VII):

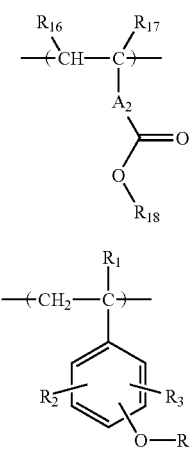

(VI)

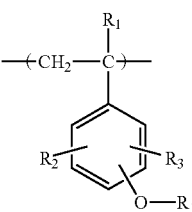

(VII)

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group group which may be substituted; $R_{16}$ and $R_{17}$, which are the same or different, each independently represents a hydrogen atom, a halogen atom, cyano group, an alkyl group which may be substituted or a haloalkyl group which may be substituted; $R_{18}$ represents $-C(R_{19})(R_{20})(R_{21})$, $-C(R_{19})(R_{20})(R_{22})$, or the group represented by formula (VIII) below; $R_{19}$ to $R_{22}$, which are the same or different, each independently represents an alkyl group, a mono- or polycyclic cycloalkyl group, an alkenyl group, an aralkyl group or an aryl group, each of which may be substituted; two of $R_{19}$, $R_{20}$ and $R_{21}$ or two of $R_{19}$, $R_{20}$ and $R_{22}$ may combine with each other to form a ring; $A_2$ represents a single bond, an alkylene group which may be substituted, alkenylene group which may be substituted, cycloalkylene group which may be substituted or arylene group group which may be substituted, $-O-CO-R_{11}-$, $-CO-O-R_{12}-$ or $-CO-N(R_{13})-R_{14}-$; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which maybe substituted, cycloalkyl group which may be substituted, aralkyl group which may be substituted or aryl group which may be substituted:

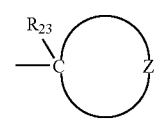

(VIII)

wherein $R_{23}$ represents an alkyl group, cycloalkyl group, alkenyl group, alkynyl group, aralkyl group or aryl group, each of which may be substituted; Z represents an atomic group forming a mono- or polycyclic alicyclic group together with the carbon atom.

5. The positive resist composition according to claim 1, which further comprises (C) a compound containing a basic nitrogen atom as an acid diffusion-suppressing agent.

6. The positive resist composition according to claim 1, wherein the compound (B) is at least one selected from the group consisting of a sulfonium salt compound and an iodonium salt compound capable of generating the following acid upon irradiation with one of an actinic ray and a radiation:

at least one acid of a perfluoroalkylsulfonic acid having at least 2 carbon atoms, a perfluoroarylsulfonic acid and an arylsulfonic acid substituted with a perfluoroalkyl group.

7. The positive resist composition according to claim 1, wherein the compound (B) is at least one selected from the group consisting of an imide-N-sulfonate compound, an oxime-N-sulfonate compound and a disulfonic compound.

8. The positive resist composition according to claim 1, wherein the resin (A) contains the repeating unit represented by formula (I) in an amount of 20 to 100 mol % based on the total components of the resin.

9. The positive resist composition according to claim 1, wherein the resin (A) has a weight average molecular weight of 1,000 to 200,000.

10. The positive resist composition according to claim 1, which comprises the resin (A) in an amount of 50 to 99.5% by weight, based on the total solid content of the composition.

11. The positive resist composition according to claim 1, which comprises the compound (B) in an amount of 0.1 to 20% by weight, based on the total solid content of the composition.

12. The positive resist composition according to claim 1, which is a positive resist composition to be irradiated with a vacuum ultraviolet ray having a wavelength of not longer than 160 nm.

13. The positive resist composition according to claim 1, which is a positive resist composition to be irradiated with $F_2$ excimer laser beam having a wavelength of 157 nm.

14. A method for forming a pattern comprises: applying the positive resist composition according to claim 1 on a substrate to form a resist film; irradiating the resist film with a vacuum ultraviolet ray having a wavelength of not longer than 160 nm; and developing the resist film.

15. The method for forming a pattern according to claim 14, wherein the vacuum ultraviolet ray is $F_2$ excimer laser beam having a wavelength of 157 nm.

16. A positive resist composition comprising:

(A) a resin capable of decomposing by the action of an acid to increase the solubility in an alkali developer; and (B) a compound capable of generating an acid upon irradiation with one of an actinic ray and a radiation, wherein the resin (A) contains a repeating unit represented by formula (I) and at least one of repeating units represented by formulae (IV) and (V):

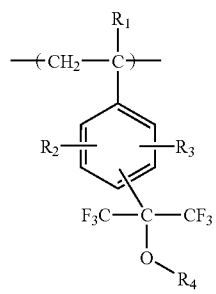
(I)

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group which may be substituted; $R_4$ represents an alkyl group which may be substituted, perfluoroalkyl group which may be substituted, cycloalkyl group which may be substituted, acyl group which may be substituted, alkoxycarbonyl group which may be substituted, alkoxycarbonylmethyl group which may be substituted or a group represented by formula (II):

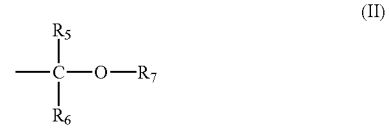
(II)

wherein $R_5$ and $R_6$, which are the same or different, each independently represents a hydrogen atom, an alkyl group which may be substituted or cycloalkyl group which may be substituted; $R_7$ represents an alkyl group which may be substituted, perfluoroalkyl group which may be substituted, cycloalkyl group which may be substituted, perfluorocycloalkyl group which may be substituted, aralkyl group which may be substituted or aryl group which may be substituted; two of $R_5$, $R_6$ and $R_7$ may combine with each other to form a ring;

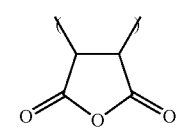
(IV)

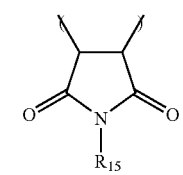
(V)

wherein $R_{15}$ represents a hydrogen atom, or an alkyl group which may be substituted, perfluoroalkyl group which may be substituted, cycloalkyl group which may be substituted, perfluorocycloalkyl group which may be substituted or aryl group which may be substituted.

17. The positive resist composition according to claim 16, wherein the resin (A) further contains a repeating unit represented by formula (III):

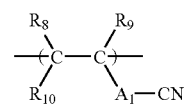
(III)

wherein $R_8$ and $R_9$, which are the same or different, each independently represents a hydrogen atom, a halogen atom, cyano group, an alkyl group which may be substituted or a haloalkyl group which may be substituted; $R_{10}$ represents a hydrogen atom, a halogen atom, an alkyl group which may be substituted, a haloalkyl group which may be substituted or a group represented by —$A_1$—CN; $A_1$ represents a single bond, an alkylene group which may be substituted, alkenylene group which may be substituted, cycloalkylene group which may be substituted or arylene group which may be substituted, —O—CO—$R_{11}$—, —CO—O—$R_{12}$— or —CO—N($R_{13}$)—$R_{14}$—; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, cycloalkyl group which may be substituted, aralkyl group which may be substituted or aryl group which may be substituted.

18. The positive resist composition according to claim 16, wherein the resin (A) further contains at least one of repeating units represented by formulae (VI) and (VII):

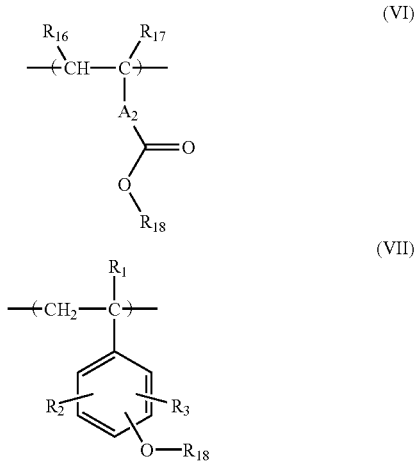

wherein $R_{23}$ represents an alkyl group, cycloalkyl group, alkenyl group, alkynyl group, aralkyl group or aryl group, each of which may be substituted; Z represents an atomic group forming a mono- or polycyclic alicyclic group together with the carbon atom.

19. The positive resist composition according to claim 16, which further comprises (C) a compound containing a basic nitrogen atom as an acid diffusion-suppressing agent.

20. The positive resist composition according to claim 16, wherein the compound (B) is at least one selected from the group consisting of a sulfonium salt compound and an iodonium salt compound capable of generating the following acid upon irradiation with one of an actinic ray and a radiation:
at least one acid of a perfluoroalkylsulfonic acid having at least 2 carbon atoms, a perfluoroarylsulfonic acid and an arylsulfonic acid substituted with a perfluoroalkyl group.

21. The positive resist composition according to claim 16, wherein the compound (B) is at least one selected from the group consisting of an imide-N-sulfonate compound, an oxime-N-sulfonate compound and a disulfonic compound.

22. The positive resist composition according to claim 16, which further comprises a surfactant containing at least one of a fluorine atom and a silicon atom.

23. A positive resist composition comprising:
(A) a resin capable of decomposing by the action of an acid to increase the solubility in an alkali developer; and
(B) a compound capable of generating an acid upon irradiation with one of an actinic ray and a radiation,
wherein the resin (A) contains a repeating unit represented by formula (I), at least one of repeating units represented by formulae (VI) and (VII), and at least one of repeating units represented by formulae (IV) and (V):

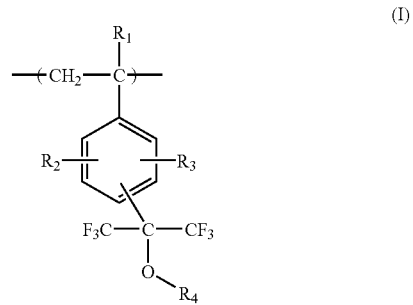

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group which may be substituted; $R_{16}$ and $R_{17}$, which are the same or different, each independently represents a hydrogen atom, a halogen atom, cyano group, an alkyl group which may be substituted or a haloalkyl group which may be substituted; $R_{18}$ represents —$C(R_{19})(R_{20})(R_{21})$, —$C(R_{19})(R_{20})(OR_{22})$, or the group represented by formula (VIII) below; $R_{19}$ to $R_{22}$, which are the same or different, each independently represents an alkyl group, a mono- or polycyclic cycloalkyl group, an alkenyl group, an aralkyl group or an aryl group, each of which may be substituted; two of $R_{19}$, $R_{20}$ and $R_{21}$ or two of $R_{19}$, $R_{20}$ and $R_{22}$ may combine with each other to form a ring; $A_2$ represents a single bond, an alkylene group which may be substituted, alkenylene group which may be substituted, cycloalkylene group which may be substituted or arylene group which may be substituted, —O—CO—$R_{11}$—, —CO—O—$R_{12}$— or —CO—N($R_{13}$)—$R_{14}$—; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, cycloalkyl group which may be substituted, aralkyl group which may be substituted or aryl group which may be substituted:

which may be substituted, alkenyl group which may be substituted, aralkyl group which may be substituted or aryl group which may be substituted; $R_4$ represents an alkyl group which may be substituted, perfluoroalkyl group which may be substituted, cycloalkyl group which may be substituted, acyl group which may be substituted, alkoxycarbonyl group which may be substituted, alkoxycarbonylmethyl group which may be substituted or a group represented by formula (II):

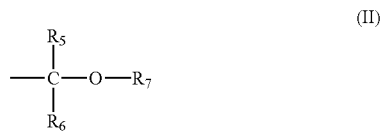

wherein $R_5$ and $R_6$, which are the same or different, each independently represents a hydrogen atom, an alkyl group which may be substituted or cycloalkyl group which may be substituted; $R_7$ represents an alkyl group which may be substituted, perfluoroalkyl group which may be substituted, cycloalkyl group which may be substituted, perfluorocycloalkyl group which may be substituted, aralkyl group which may be substituted or aryl group which may be substituted; two of $R_5$, $R_6$ and $R_7$ may combine with each other to form a ring;

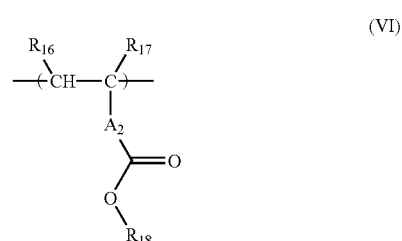

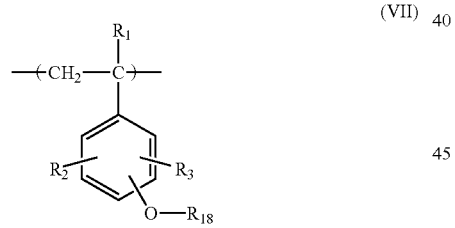

wherein $R_1$ represents a hydrogen atom, a halogen atom, cyano group, an alkyl group which may be substituted or haloalkyl group which may be substituted; $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group which may be substituted; $R_{16}$ and $R_{17}$, which are the same or different, each independently represents a hydrogen atom, a halogen atom, cyano group, an alkyl group which may be substituted or a haloalkyl group which may be substituted; $R_{18}$ represents $—C(R_{19})(R_{20})(R_{21})$, $—C(R_{19})(R_{20})(OR_{22})$, or the group represented by formula (VIII) below; $R_{19}$ to $R_{22}$, which are the same or different, each independently represents an alkyl group, a mono- or polycyclic cycloalkyl group, an alkenyl group, an aralkyl group or an aryl group, each of which may be substituted; two of $R_{19}$, $R_{20}$ and $R_{21}$ or two of $R_{19}$, $R_{20}$ and $R_{22}$ may combine with each other to form a ring; $A_2$ represents a single bond, an alkylene group which may be substituted, alkenylene group which may be substituted, cycloalkylene group which may be substituted or arylene group which may be substituted, $—O—CO—R_{11}—$, $—CO—O—R_{12}—$ or $—CO—N(R_{13})—R_{14}—$; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, cycloalkyl group which may be substituted, aralkyl group which may be substituted or aryl group which may be substituted:

wherein $R_{23}$ represents an alkyl group, cycloalkyl group, alkenyl group, alkynyl group, aralkyl group or aryl group, each of which may be substituted; Z represents an atomic group forming a mono- or polycyclic alicyclic group together with the carbon atom;

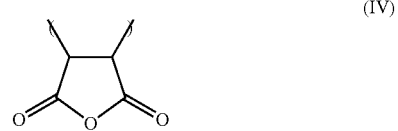

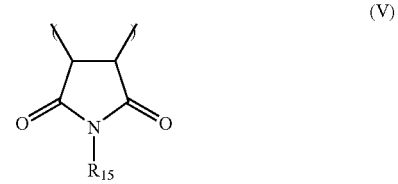

wherein $R_{15}$ represents a hydrogen atom, or an alkyl group which may be substituted, a perfluoroalkyl group which may be substituted, a cycloalkyl group which may be substituted, a perfluorocycloalkyl group which may be substituted or an aryl group which may be substituted.

24. The positive resist composition according to claim 23, wherein the resin (A) further contains a repeating unit represented by formula (III):

wherein $R_8$ and $R_9$, which are the same or different, each independently represents a hydrogen atom, a halogen atom, cyano group, an alkyl group which may be substituted or a haloalkyl group which may be substituted; $R_{10}$ represents a hydrogen atom, a halogen atom, an alkyl group which may be substituted, a haloalkyl group which may be substituted or a group represented by —$A_1$—CN; $A_1$ represents a single bond, an alkylene group which may be substituted, alkenylene group which may be substituted, cycloalkylene group which may be substituted or arylene group which may be substituted, —O—CO—$R_{11}$—, —CO—O—$R_{12}$— or —CO—N($R_{13}$)—$R_{14}$—; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, cycloalkyl group which may be substituted, aralkyl group which may be substituted or aryl group which may be substituted.

25. The positive resist composition according to claim 23, which further comprises (C) a compound containing a basic nitrogen atom as an acid diffusion-suppressing agent.

26. The positive resist composition according to claim 23, wherein the compound (B) is at least one selected from the group consisting of a sulfonium salt compound and an iodonium salt compound capable of generating the following acid upon irradiation with one of an actinic ray and a radiation:
at least one acid of a perfluoroalkylsulfonic acid having at least 2 carbon atoms, a perfluoroarylsulfonic acid and an arylsulfonic acid substituted with a perfluoroalkyl group.

27. The positive resist composition according to claim 23, which the compound (B) is at least one selected from the group consisting of an imide-N-sulfonate compound, an oxime-N-sulfonate compound and a disulfonic compound.

28. The positive resist composition according to claim 23, which further comprises a surfactant containing at least one of a fluorine atom and a silicon atom.

29. A positive resist composition comprising:
(A) a resin capable of decomposing by the action of an acid to increase the solubility in an alkali developer; and
(B) a compound capable of generating an acid upon irradiation with one of an actinic ray and a radiation, wherein the resin (A) contains a repeating unit represented by formula (I) and a repeating unit represented by formula (VII):

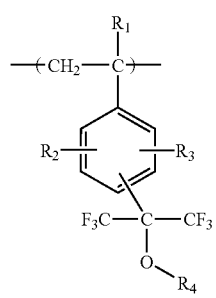

(I)

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group which may be substituted; $R_4$ represents a hydrogen atom, an alkyl group which may be substituted, perfluoroalkyl group which may be substituted, cycloalkyl group which may be substituted, acyl group which may be substituted, alkoxycarbonyl group which may be substituted, alkoxycarbonylmethyl group which may be substituted or a group represented by formula (II):

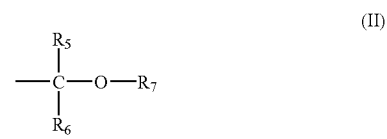

(II)

wherein $R_5$ and $R_6$ which are the same or different, each independently represents a hydrogen atom, an alkyl group which may be substituted or cycloalkyl group which may be substituted; $R_7$ represents an alkyl group which may be substituted, perfluoroalkyl group which may be substituted, cycloalkyl group which may be substituted, perfluorocycloalkyl group which may be substituted, aralkyl group which may be substituted or aryl group which may be substituted; two of $R_5$, $R_6$ and $R_7$ may combine with each other to form a ring;

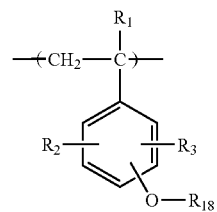

(VII)

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group which may be substituted; $R_{18}$ represents —C($R_{19}$)($R_{20}$)($R_{21}$), —C($R_{19}$)($R_{20}$)($OR_{22}$), or the group represented by formula (VIII) below; $R_{19}$ to $R_{22}$, which are the same or different, each independently represents an alkyl group, a mono- or polycyclic cycloalkyl group, an alkenyl group, an aralkyl group or an aryl group, each of which may be substituted; two of $R_{19}$, $R_{20}$ and $R_{21}$ or two of $R_{19}$, $R_{20}$ and $R_{22}$ may combine with each other to form a ring:

(VIII)

wherein $R_{23}$ represents an alkyl group, cycloalkyl group, alkenyl group, alkynyl group, aralkyl group or aryl group, each of which may be substituted; Z represents an atomic group forming a mono- or polycyclic alicyclic group together with the carbon atom.

30. The positive resist composition according to claim 29, wherein the resin (A) further contains a repeating unit represented by formula (III):

(III)

wherein $R_8$ and $R_9$, which are the same or different, each independently represents a hydrogen atom, a halogen atom, cyano group, an alkyl group which may be substituted or a haloalkyl group which may be substituted; $R_{10}$ represents a hydrogen atom, a halogen atom, an alkyl group which may be substituted, a haloalkyl group which may be substituted or a group represented by —$A_1$—CN; $A_1$ represents a single bond, an alkylene group which may be substituted, alkenylene group which may be substituted, cycloalkylene group which may be substituted or arylene group which may be substituted, —O—CO—$R_{11}$—, —CO—O—$R_{12}$— or —CO—N($R_{13}$)—$R_{14}$—; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, cycloalkyl group which may be substituted, aralkyl group which may be substituted or aryl group which may be substituted.

31. The positive resist composition according to claim 30, wherein the resin (A) further contains at least one of repeating units represented by formulae (IV) and (V):

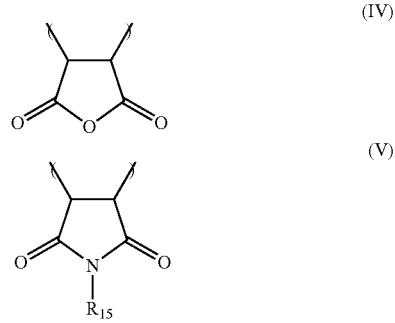

(IV)

(V)

wherein $R_{15}$ represents a hydrogen atom, or an alkyl group which may be substituted, perfluoroalkyl group which may be substituted, cycloalkyl group which may be substituted, perfluorocycloalkyl group which may be substituted or aryl group which may be substituted.

32. The positive resist composition according to claim 30, which further comprises (C) a compound containing a basic nitrogen atom as an acid diffusion-suppressing agent.

33. The positive resist composition according to claim 30, wherein the compound (B) is at least one selected from the group consisting of a sulfonium salt compound and an iodonium salt compound capable of generating the following acid upon irradiation with one of an actinic ray and a radiation:
at least one acid of a perfluoroalkylsulfonic acid having at least 2 carbon atoms, a perfluoroarylsulfonic acid and an arylsulfonic acid substituted with a perfluoroalkyl group.

34. The positive resist composition according to claim 29, wherein the compound (B) is at least one selected from the group consisting of an imide-N-sulfonate compound, an oxime-N-sulfonate compound and a disulfonic compound.

35. The positive resist composition according to claim 29, which further comprises a surfactant containing at least one of a fluorine atom and a silicon atom.

36. A positive resist composition comprising:
(A) a resin capable of decomposing by the action of an acid to increase the solubility in an alkali developer; and
(B) a compound capable of generating an acid upon irradiation with one of an actinic ray and a radiation, and is at least one selected from the group consisting of an imide-N-sulfonate compound, an oxime-N-sulfonate compound and a disulfonic compound,
wherein the resin (A) contains a repeating unit represented by formula (I) and at least one of repeating units represented by formulae (VI) and (VII):

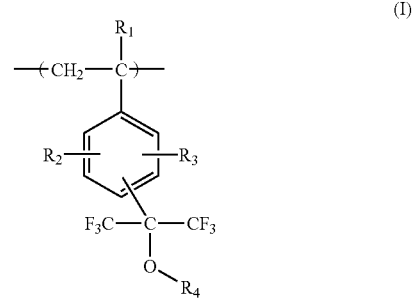

(I)

wherein $R_1$ represents a hydrogen atom, a halogen atom, cyano group, an alkyl group which may be substituted or haloalkyl group which may be substituted: $R_2$ and $R_3$, which are the same or different, each independently represents a hydrogen atom, hydroxyl group, a halogen atom, cyano group, an alkoxy group, an acyl group, an alkyl group which may be substituted, cycloalkyl group which may be substituted, alkenyl group which may be substituted, aralkyl group which may be substituted or aryl group which may be substituted; $R_4$ represents an alkyl group which may be substituted, perfluoroalkyl group which may be substituted, cycloalkyl group which may be substituted, acyl group which may be substituted, alkoxycarbonyl group which may be substituted, alkoxycarbonylmethyl group which may be substituted or a group represented by formula (II):

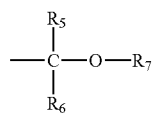

(II)

wherein $R_5$ and $R_6$, which are the same or different, each independently represents a hydrogen atom, an alkyl group which may be substituted or cycloalkyl group which may be substituted; $R_7$ represents an alkyl group which may be substituted, perfluoroalkyl group which may be substituted, cycloalkyl group which may be substituted, perfluorocycloalkyl group which may be substituted, aralkyl group which may be substituted or aryl group which may be substituted; two of $R_5$, $R_6$ and $R_7$ may combine with each other to form a ring;

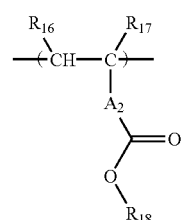

(VI)

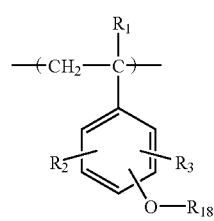

(VII)

wherein $R_1$ represents a hydrogen atom, a halogen atom, a cyano group, an alkyl group which may be substituted or a haloalkyl group which may be substituted; $R_2$ and $R_3$, which are the same or different, each independently represents a hydrogen atom, a hydroxyl group, a halogen atom, a cyano group, an alkoxy group, an acyl group, an alkyl group which may be substituted, a cycloalkyl group which may be substituted, an alkenyl group which may be substituted, an aralkyl group which may be substituted or an aryl group which may be substituted; $R_{16}$ and $R_{17}$, which are the same or different, each independently represents a hydrogen atom, a halogen atom, a cyano group, an alkyl group which may be substituted or a haloalkyl group which may be substituted; $R_{18}$ represents —$C(R_{19})(R_{20})(R_{21})$, —$C(R_{19})(R_{20})(OR_{22})$, or the group represented by formula (VIII) below; $R_{19}$ to $R_{22}$, which are the same or different, each independently represents an alkyl group, a mono- or polycyclic cycloalkyl group, an alkenyl group, an aralkyl group or an aryl group, each of which may be substituted; two of $R_{19}$, $R_{20}$ and $R_{21}$ or two of $R_{19}$, $R_{20}$ and $R_{22}$ may combine with each other to form a ring; $A_2$ represents a single bond, an alkylene group which may be substituted, an alkenylene group which may be substituted, a cycloalkylene group which may be substituted or an arylene group which may be substituted, —O—CO—$R_{11}$—, —CO—O—$R_{12}$— or —CO—N($R_{13}$)—$R_{14}$—; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, a cycloalkyl group which may be substituted, an aralkyl group which may be substituted or an aryl group which may be substituted:

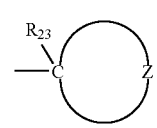

(VIII)

wherein $R_{23}$ represents an alkyl group, a cycloalkyl group, an alkenyl group, an alkynyl group, an aralkyl group or an aryl group, each of which may be substituted; and Z represents an atomic group forming a mono- or polycyclic alicyclic group together with the carbon atom.

37. The positive resist composition according to claim 36, wherein the resin (A) further contains a repeating unit represented by formula (III):

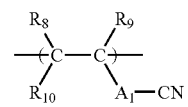

(III)

wherein $R_8$ and $R_9$, which are the same or different, each independently represents a hydrogen atom, a halogen atom, a cyano group, an alkyl group which may be substituted or a haloalkyl group which may be substituted; $R_{10}$ represents a hydrogen atom, a halogen atom, an alkyl group which may be substituted, a haloalkyl group which may be substituted or a group represented by —$A_1$—CN; $A_1$ represents a single bond, an alkylene group which may be substituted, an alkenylene group which may be substituted, a cycloalkylene group which may be substituted or an arylene group which may be substituted, —O—CO—$R_{11}$—, —CO—O—$R_{12}$— or —CO—N($R_{13}$)—$R_{14}$—; $R_{11}$, $R_{12}$ and $R_{14}$, which are the same or different, each independently represents a single bond, an alkylene, alkenylene, cycloalkylene or arylene group, each of which may contain an ether group, an ester group, an amido group, a urethane group or a ureido group; $R_{13}$ represents a hydrogen atom, an alkyl group which may be substituted, a cycloalkyl group which may be substituted, an aralkyl group which may be substituted or an aryl group which may be substituted.

38. The positive resist composition according to claim 36, which further comprises (C) a compound containing a basic nitrogen atom as an acid diffusion-suppressing agent.

39. The positive resist composition according to claim 36, wherein the compound (B) is at least one selected from the group consisting of a sulfonium salt compound and an iodonium salt compound capable of generating the following acid upon irradiation with one of an actinic ray and a radiation:

at least one acid of a perfluoroalkylsulfonic acid having at least 2 carbon atoms, a perfluoroarylsulfonic acid and an arylsulfonic acid substituted with a perfluoroalkyl group.

40. The positive resist composition according to claim 36, which further comprises a surfactant containing at least one of a fluorine atom and a silicon atom.

* * * * *